US012620449B2

(12) United States Patent
Liu et al.

(10) Patent No.: US 12,620,449 B2
(45) Date of Patent: May 5, 2026

(54) ADAPTIVE GIDL VOLTAGE FOR ERASING NON-VOLATILE MEMORY

(71) Applicant: Sandisk Technologies, Inc., Milpitas, CA (US)

(72) Inventors: Yihang Liu, Santa Clara, CA (US); Xiaochen Zhu, Milpitas, CA (US); Lito De La Rama, San Jose, CA (US); Feng Gao, Union City, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 607 days.

(21) Appl. No.: 17/899,765

(22) Filed: Aug. 31, 2022

(65) Prior Publication Data

US 2024/0071533 A1 Feb. 29, 2024

(51) Int. Cl.
*G11C 16/34* (2006.01)
*G11C 16/04* (2006.01)
*G11C 16/16* (2006.01)

(52) U.S. Cl.
CPC ...... *G11C 16/3495* (2013.01); *G11C 16/0433* (2013.01); *G11C 16/0483* (2013.01); *G11C 16/16* (2013.01); *G11C 16/3445* (2013.01)

(58) Field of Classification Search
CPC . G11C 16/3495; G11C 16/0483; G11C 16/16; G11C 16/3445; G11C 11/5671; G11C 16/08; G11C 16/349; G11C 11/5635
See application file for complete search history.

(56) References Cited

U.S. PATENT DOCUMENTS

| | | | |
|---|---|---|---|
| 8,885,412 B2 | 11/2014 | Li et al. | |
| 10,019,332 B1 | 7/2018 | Sehgal et al. | |
| 10,923,196 B1 | 2/2021 | Rabkin et al. | |
| 2019/0244673 A1 | 8/2019 | Yang et al. | |
| 2019/0378574 A1* | 12/2019 | Lee | G11C 11/5635 |
| 2020/0411122 A1* | 12/2020 | Song | G11C 16/349 |
| 2023/0134907 A1* | 5/2023 | Lee | G11C 16/08 |
| | | | 365/185.11 |

(Continued)

OTHER PUBLICATIONS

Goda, A., "Recent Progress on 3D NAND Flash Technologies", https://www.mdpi.com/2079-9292/10/24/3156 , vol. 10, Issue No. 24, pp. 1-16, Dec. 18, 2021.

(Continued)

*Primary Examiner* — Donald HB Braswell
(74) *Attorney, Agent, or Firm* — PEARL COHEN ZEDEK LATZER BARATZ LLP

(57) ABSTRACT

An apparatus is provided that includes a block of memory cells having a NAND string that includes a first select transistor, and a control circuit coupled to the block of memory cells. The control circuit is configured to perform an erase operation on the block of memory cells by determining a first count of a number of times that the block of memory cells previously has been programmed and erased, determining based on the first count a first drain-to-gate voltage of the first select transistor, wherein the first drain-to-gate voltage is configured to cause the first select transistor to generate a first gate-induced drain leakage current, and applying a first erase pulse to the first select transistor based on the determined first drain-to-gate voltage.

12 Claims, 19 Drawing Sheets

(56) References Cited

U.S. PATENT DOCUMENTS

2024/0145017  A1*  5/2024  Ham ...................... G11C 16/22
2024/0170072  A1*  5/2024  Lim ................... G11C 16/0433

OTHER PUBLICATIONS

Lee, G. H., et al., "Architecture and Process Integration Overview of 3D NAND Flash Technologies", https://www.mdpi.com/2076-3417/11/15/6703, vol. 11, No. 15, pp. 1-18, Jul. 21, 2021.
Zhang, H., et al., "An SVM-Based NAND Flash Endurance Prediction Method", https://www.mdpi.com/2072-666X/12/7/746, vol. 12, No. 7, pp. 1-21, (Jun. 25, 2021).

* cited by examiner

202

400a

400b

| Block M-1 |
|:---:|
| |
| ... |
| |
| Block 2 |
| Block 1 |
| Block 0 |

402

| Block M-1 |
|:---:|
| |
| ... |
| |
| Block 2 |
| Block 1 |
| Block 0 |

FIG. 4A

Figure 4C:
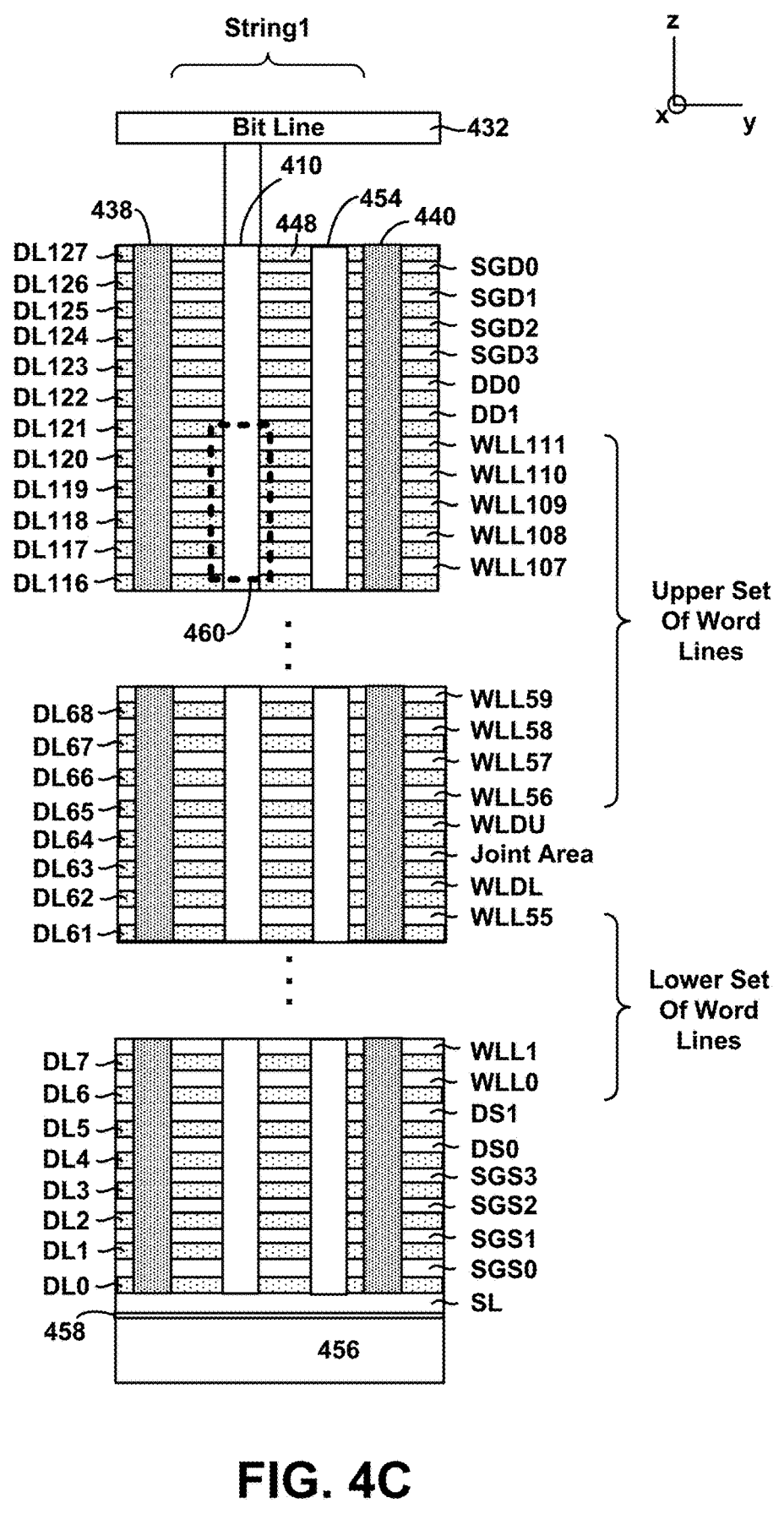

String1

Bit Line — 432

410

438

448   454   440

DL127   SGD0
DL126   SGD1
DL125   SGD2
DL124   SGD3
DL123   DD0
DL122   DD1
DL121   WLL111
DL120   WLL110
DL119   WLL109
DL118   WLL108
DL117   WLL107
DL116

460

Upper Set
Of Word
Lines

DL68   WLL59
DL67   WLL58
DL66   WLL57
DL65   WLL56
DL64   WLDU
DL63   Joint Area
DL62   WLDL
DL61   WLL55

Lower Set
Of Word
Lines

DL7   WLL1
DL6   WLL0
DL5   DS1
DL4   DS0
DL3   SGS3
DL2   SGS2
DL1   SGS1
DL0   SGS0
   SL

458

456

FIG. 4C of
memory
cells

S0 S1 S2 S3 S4 S5 S6 S7

Vt

Vv1 Vv2 Vv3 Vv4 Vv5 Vv6 Vv7

Vr1 Vr2 Vr3 Vr4 Vr5 Vr6 Vr7

| | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

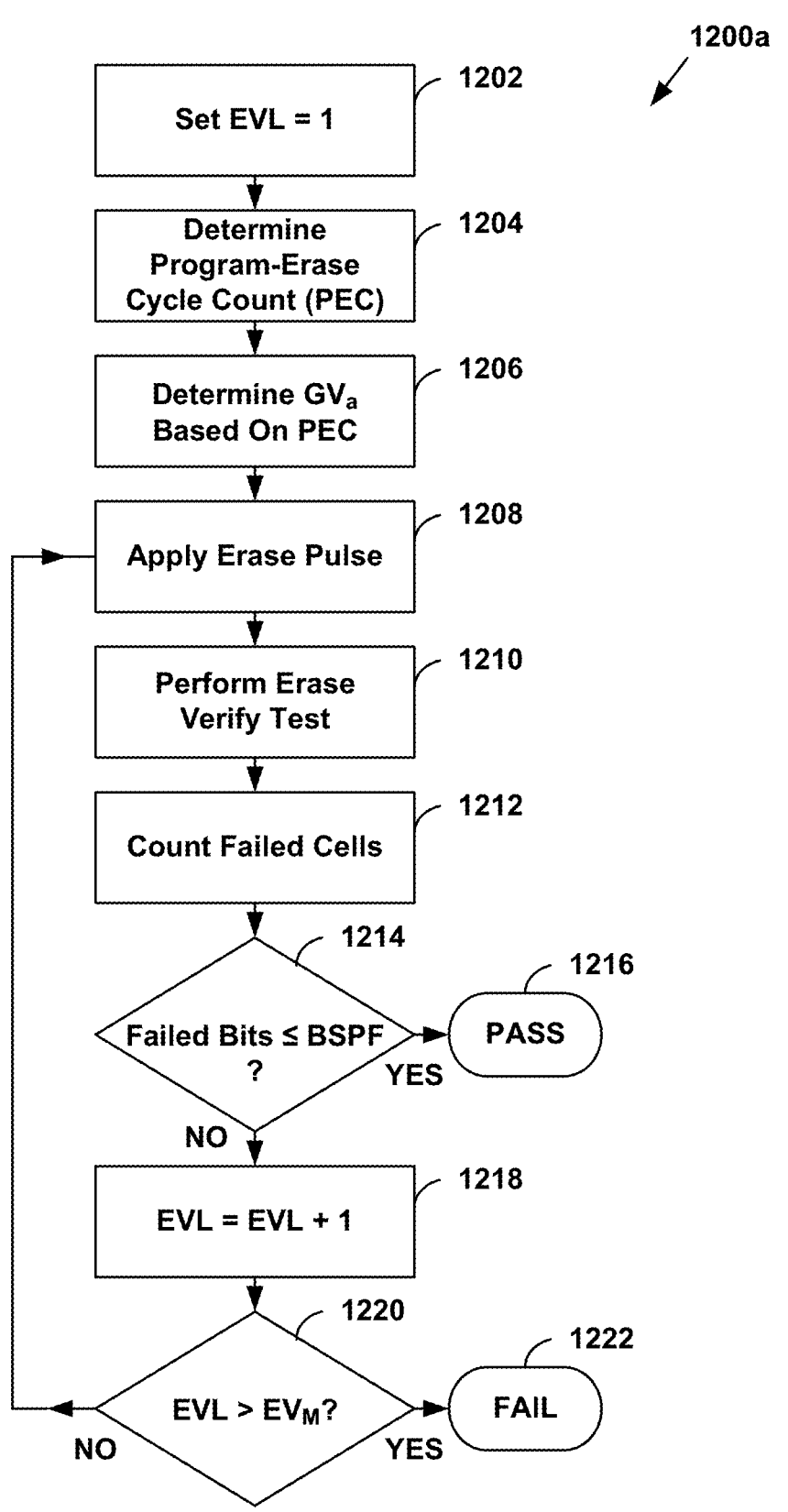
1200a
1202 — Set EVL = 1
1204 — Determine Program-Erase Cycle Count (PEC)
1206 — Determine GV$_a$ Based On PEC
1208 — Apply Erase Pulse
1210 — Perform Erase Verify Test
1212 — Count Failed Cells
1214 — Failed Bits ≤ BSPF ?
1216 — PASS (YES)
NO
1218 — EVL = EVL + 1
1220 — EVL > EV$_M$?
1222 — FAIL (YES)
NO
FIG. 12A1

| PEC | $GV_a$ |
|---|---|
| 1 – 9,999 | $GV_0$ |
| 10,000 – 19,999 | $GV_0 + \Delta$ |
| 20,000 – 29,999 | $GV_0 + 2 \times \Delta$ |
| 30,000 – 39,999 | $GV_0 + 3 \times \Delta$ |
| 40,000 – 49,999 | $GV_0 + 4 \times \Delta$ |
| ⋮ | ⋮ |

FIG. 12A2

ADAPTIVE GIDL VOLTAGE FOR ERASING NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, as memory cells decrease in size and memory arrays increase in density, maintaining the integrity of data being stored becomes more challenging.

BRIEF DESCRIPTION OF THE DRAWINGS

Like-numbered elements refer to common components in the different figures.

FIG. 4A is a block diagram of a memory structure having two planes.

FIG. 4C depicts a cross sectional view of a portion of a block of memory cells.

FIG. 12A1 depicts a flowchart describing an embodiment of a process for erasing a population of memory cells.

FIG. 12A2 depicts a table of program-erase cycle count values and corresponding adaptive GIDL voltage values.

DETAILED DESCRIPTION

Figure 1:
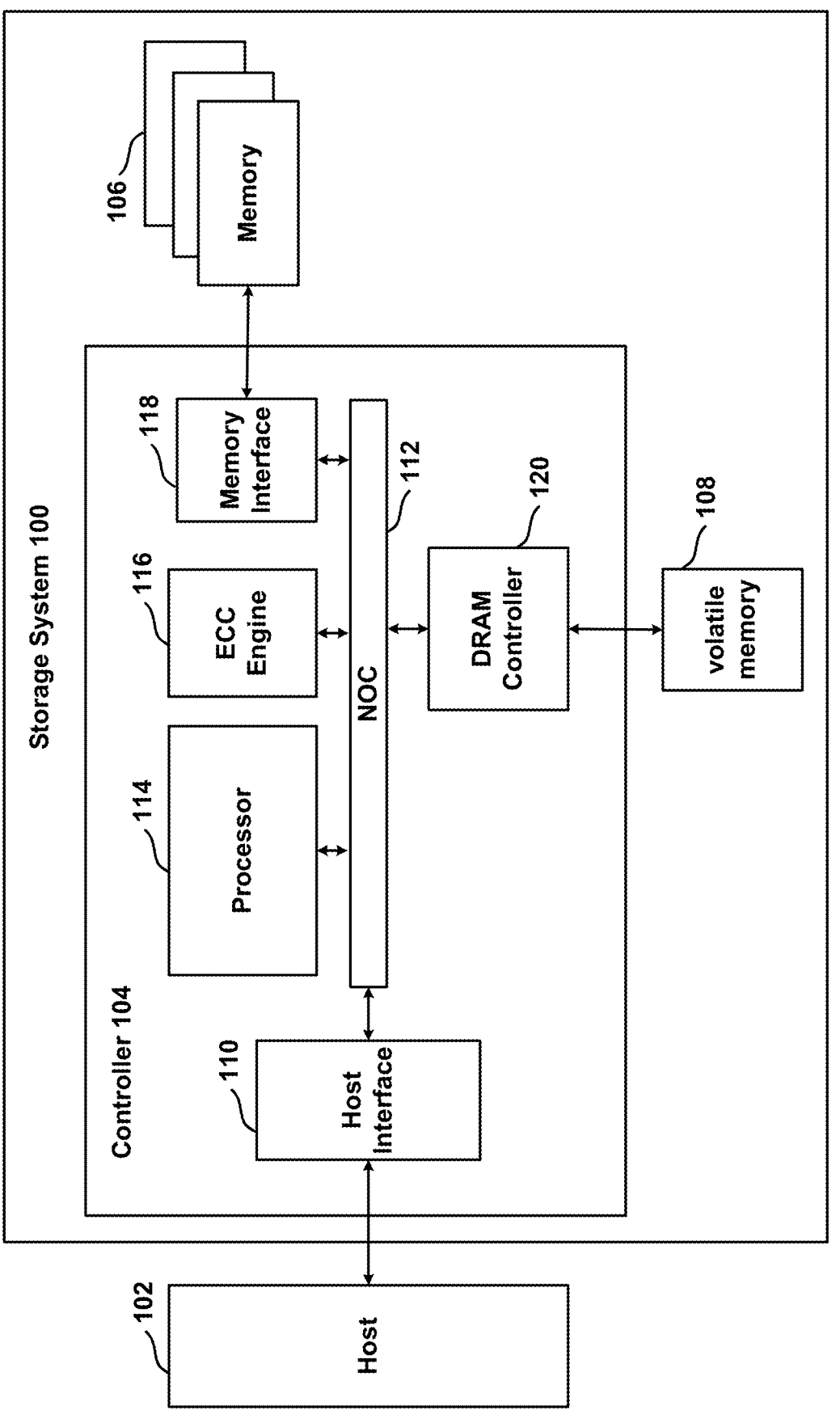
FIG. 1 is a block diagram depicting one embodiment of a memory system.

A 3D stacked non-volatile memory device can be arranged in multiple blocks, where typically an erase operation is performed one block at a time. An erase operation can include multiple erase-verify iterations which are performed until an erase-verify condition is met for the block, at which point the erase operation ends.

In one approach, the memory device includes NAND strings which have a drain-side select gate (SGD) on one end and a source-side select gate (SGS) on the other end. The select gates play an important role in an erase operation because they are used to generate a sufficient amount of gate-induced drain leakage (GIDL) current to boost the NAND string channel. Boosting the channel creates a large channel-to-gate voltage which drives holes into the charge trapping layers, reducing the threshold voltage of each memory cell. Such a technique is referred to herein as "GIDL Erase."

In one approach, erase pulses are applied to one or both of the SGD and SGS of a NAND string to provide a drain-to-gate voltage of a sufficiently high magnitude (referred to herein as a GIDL voltage that the select transistor generates a GIDL current. However, the amount of GIDL current generated for a given GIDL voltage (referred to herein as "GIDL current efficiency") decreases over the lifetime of a memory cell or group of memory cells. As GIDL current efficiency decreases, channel boosting decreases and corresponding threshold voltage reduction decreases.

Technology is described for providing an adaptive GIDL voltage for erase operations on an erase block of non-volatile memory cells. In an embodiment, the value of the adaptive GIDL voltage is determined based on the number of program-erase cycles for the erase block. In an embodiment, the adaptive GIDL voltage increases as the number of program-erase cycles for the erase block increases. In another embodiment, the value of the adaptive GIDL voltage is determined based on the number of erase-verify loops used to erase the erase block. In an embodiment, the adaptive GIDL voltage increases as the number of erase-verify loops increases.

Without wanting to be bound by any particular theory, it is believed that increasing the adaptive GIDL voltage as the number of program-erase cycles or the erase-verify loop count increases may compensate for the reduction of GIDL current efficiency that occurs with increasing program-erase cycle count.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multistate memory architectures, significant advantages in memory technology have resulted from steadily scaling down the physical dimensions of memory cells. Smaller memory cells can be packed more densely on a given die area, allowing higher memory capacity for the same price as an older memory technology.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure.

In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
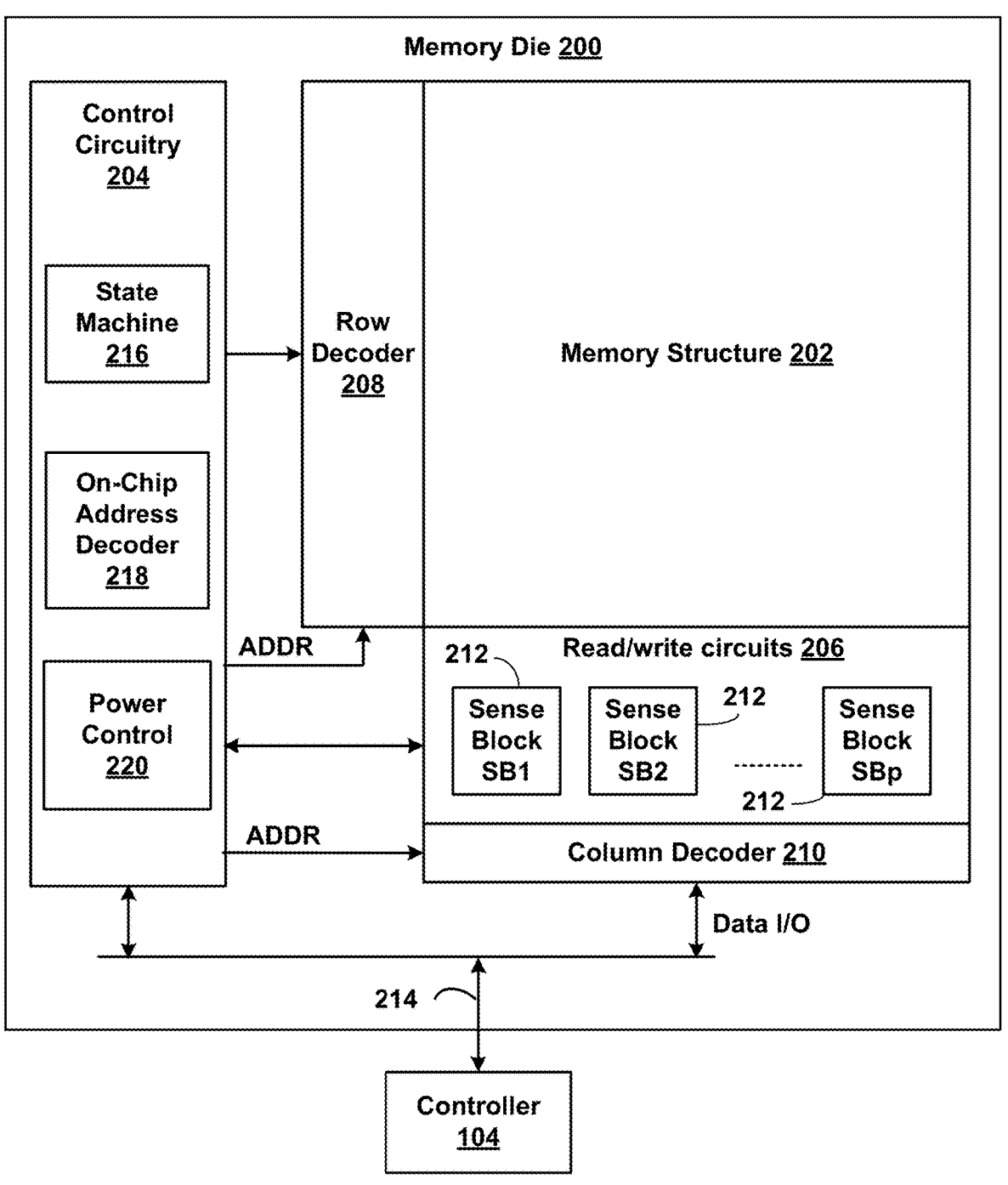
FIG. 2 is a block diagram of one embodiment of a memory die.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control circuit 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
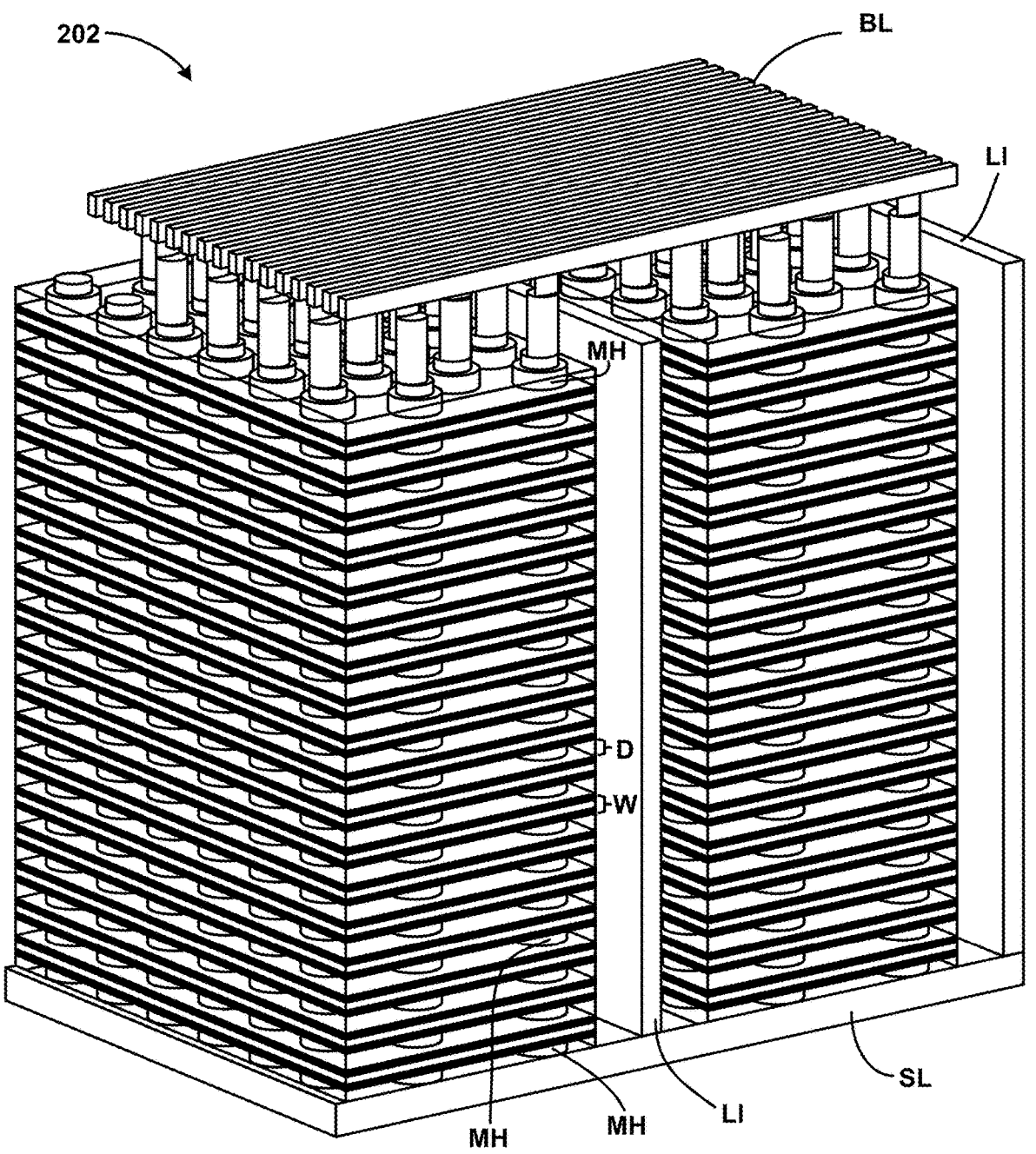
FIG. 3 is a perspective view of a portion of one embodiment of a three dimensional memory structure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 are described below.

Figure 4A:
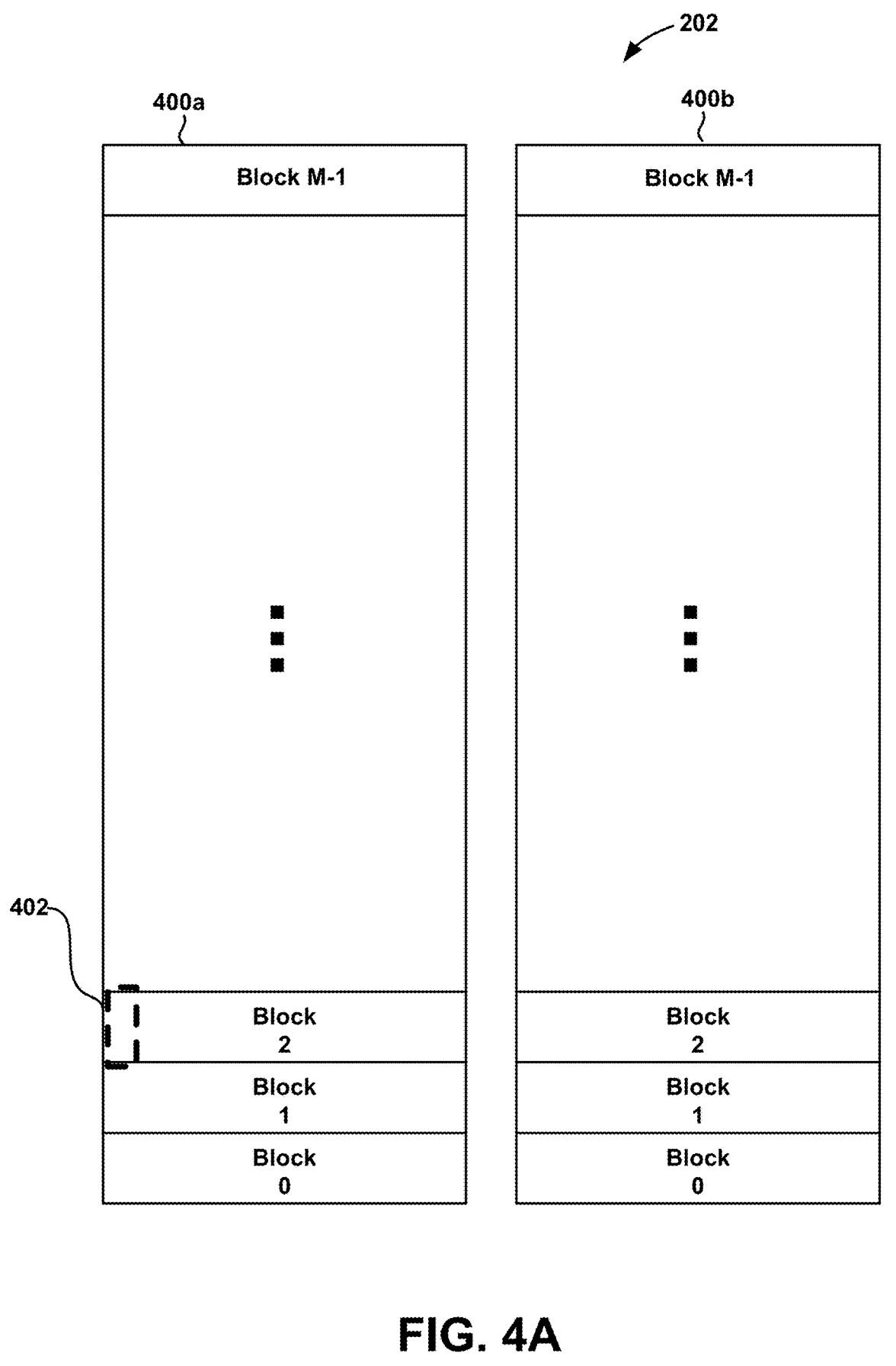

FIG. 4A is a block diagram explaining one example organization of memory structure 202, which is divided into two planes 400a and 400b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
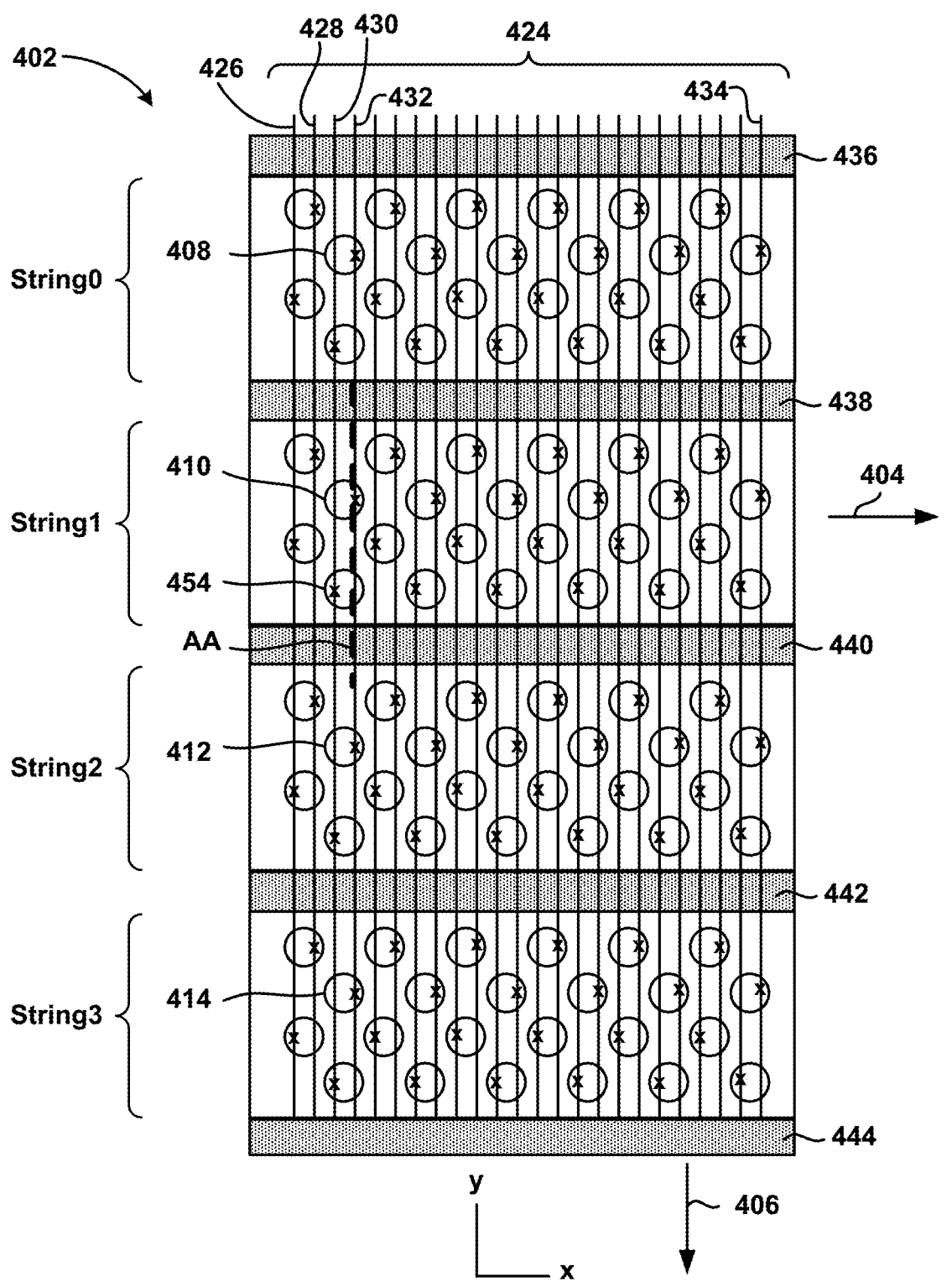
FIG. 4B depicts a top view of a portion of a block of memory cells.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, Sting2 and String3. In the layers of the block that implement memory cells, String0, String1, Sting2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, Sting2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, Sting2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

FIG. 4C depicts a portion of one embodiment of a three dimensional memory structure 202 showing a cross-sectional view along line AA of FIG. 4B. This cross sectional view cuts through memory holes 410 and 454 of String1 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twelve data word line layers WLL0-WLL111 for connecting to memory cells. Other embodiments can implement more or less than four drain side select layers, more or less than four source side select layers, more or less than six dummy word line layers, and more or less than one hundred and twelve word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL111 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL127. For example, dielectric layer DL120 is above word line layer WLL110 and below word line layer WLL111. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL111 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twelve word line layers intermixed with dielectric layers. To ease this burden, one embodiment includes laying down a first stack of fifty-six word line layers alternating with dielectric layers, laying down the Joint Area, and laying down a second stack of fifty-six word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
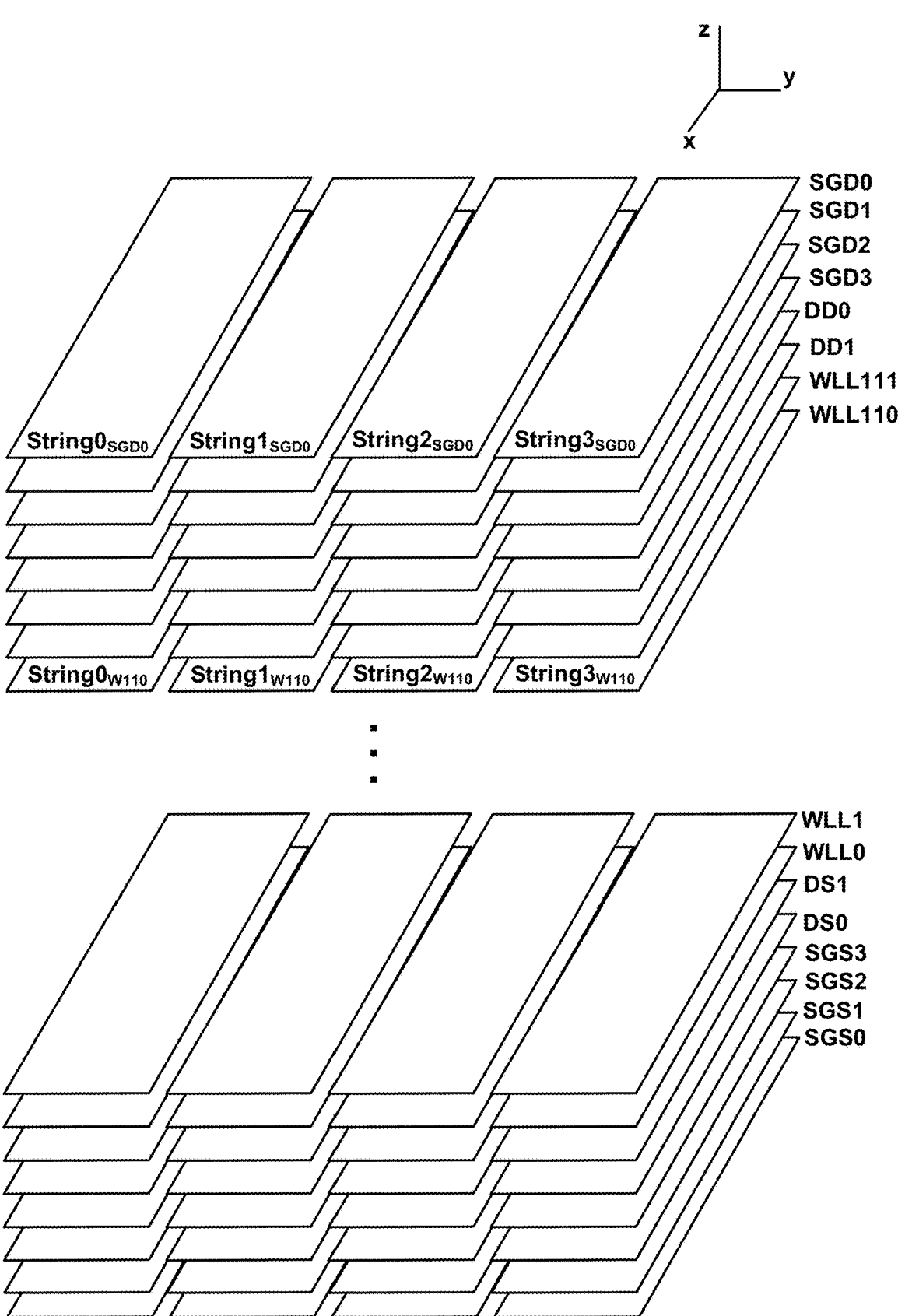
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL111) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL110 is divided into regions $String0_{W110}$, $String1_{W110}$, $String2_{W110}$ and $String3_{W110}$. In an embodiment, the four word line fingers on a same level are connected together. In another embodiment, each word line finger operates as a separate word line.

Likewise, drain side select gate layer SGD0 (the top layer) is divided into regions $Strin0_{SGD0}$, $String1_{SGD0}$, $String2_{SGD0}$ and $String3_{SGD0}$, also known as fingers or select line fingers. In an embodiment, the four select line fingers on a same level are connected together. In another embodiment, each select line finger operates as a separate word line.

Figure 4E:
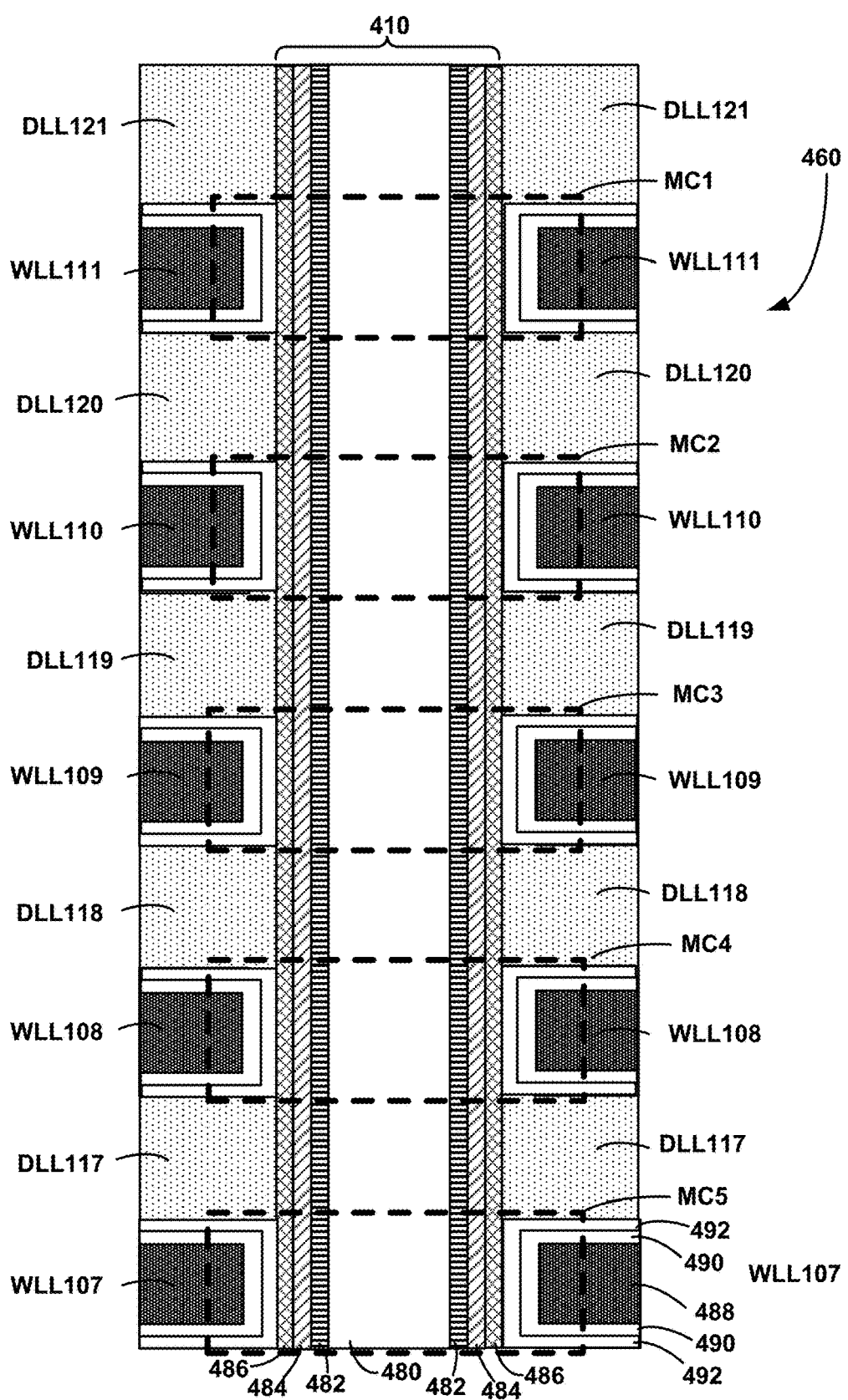
FIG. 4E is a cross sectional view of a memory hole of memory cells.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL121, DLL120, DLL119, DLL118 and DLL117, as well as word line layers WLL107, WLL108, WLL109, WLL110, and WLL111. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL111 and a portion of memory hole 410 comprise a memory cell MC1. Word line layer WLL110 and a portion of memory hole 410 comprise a memory cell MC2. Word line layer WLL109 and a portion of memory hole 410 comprise a memory cell MC3. Word line layer WLL108 and a portion of memory hole 410 comprise a memory cell MC4. Word line layer WLL107 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage, described in more detail below.

Figure 4F:
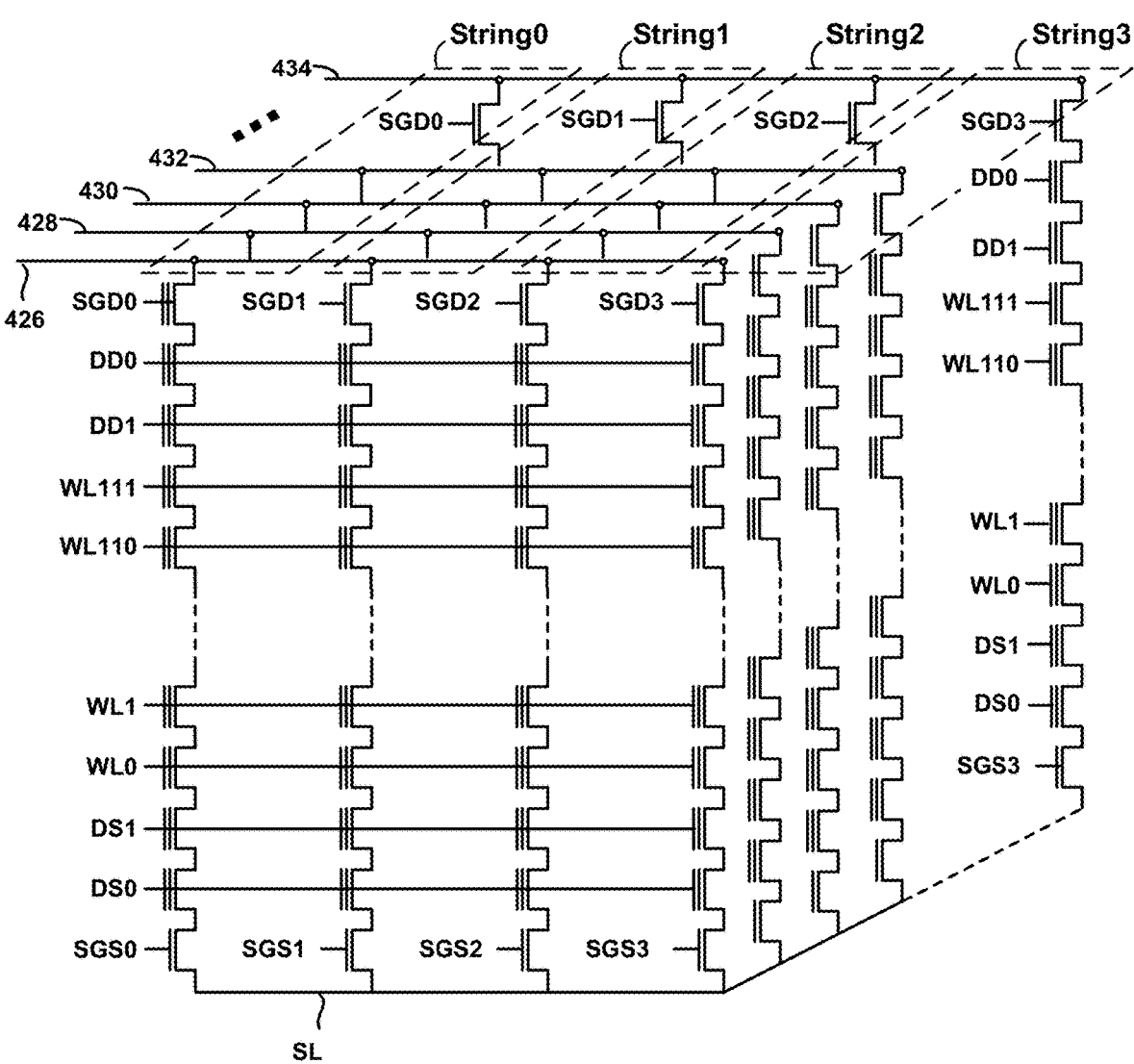
FIG. 4F is a schematic of a plurality of NAND strings.

FIG. 4F is a schematic diagram of corresponding to portion 402 in Block 2 of FIGS. 4A-E, including bit lines 426, 428, 430, 432, . . . 434, and word lines WLL0-WLL111. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

As described above, portion 402 can be divided into four regions designated as String0, String1, Sting2 and String3. String® corresponds to those vertical NAND strings controlled by select transistors SGD0 and SGS0, String1 corresponds to those vertical NAND strings controlled by select transistors SGD1 and SGS1, String2 corresponds to those vertical NAND strings controlled by select transistors SGD2 and SGS2, and String3 corresponds to those vertical NAND strings controlled by select transistors SGD3 and SGS3.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
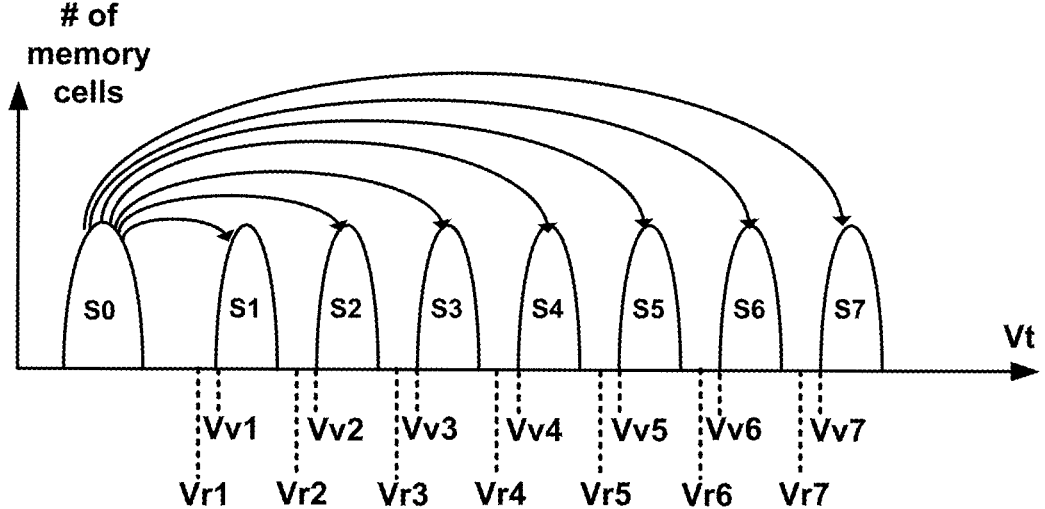
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data states S1, S2, S3, S4, S5, S6 and S7, the system will test whether those memory cells have a threshold voltage greater than or equal to Vv1, Vv2, Vv3, Vv4, Vv5, Vv6 and Vv7, respectively.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S to data state S3, and so on. The arrows of FIG. 5 represent full sequence programming.

The technology described herein also can be used with other types of programming in addition to full sequence programming (including, but not limited to, multiple stage/ phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

Figures 7A, 7B, 7C, 7D, 7E:
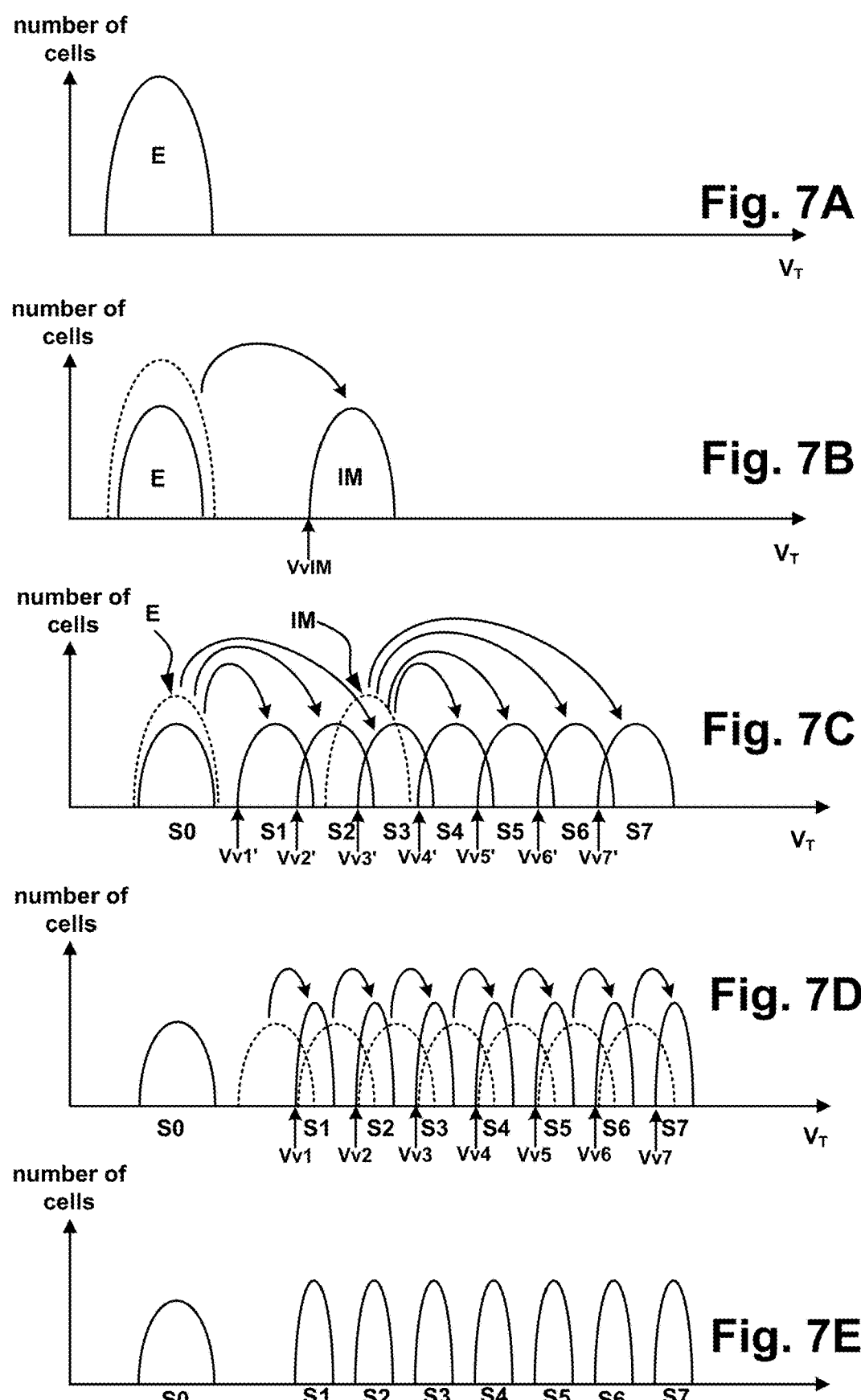
FIGS. 7A-7E depict various threshold voltage distributions and describe a process for programming non-volatile memory.

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

A programming operation for a set of memory cells typically involves applying a series of program voltage pulses to the memory cells after the memory cells are provided in an erased state. For example, the program voltage pulses may be applied to a word line which is connected to control gates of the memory cells.

In one approach, incremental step pulse programming (ISPP) is performed, where the program voltage pulse amplitude is sequentially increased by a step size. Verify operations may be performed after each program voltage pulse to determine whether the memory cells have completed programming. When programming is completed for a memory cell, the memory cell can be locked out from further programming while programming continues for other memory cells.

Figure 8:
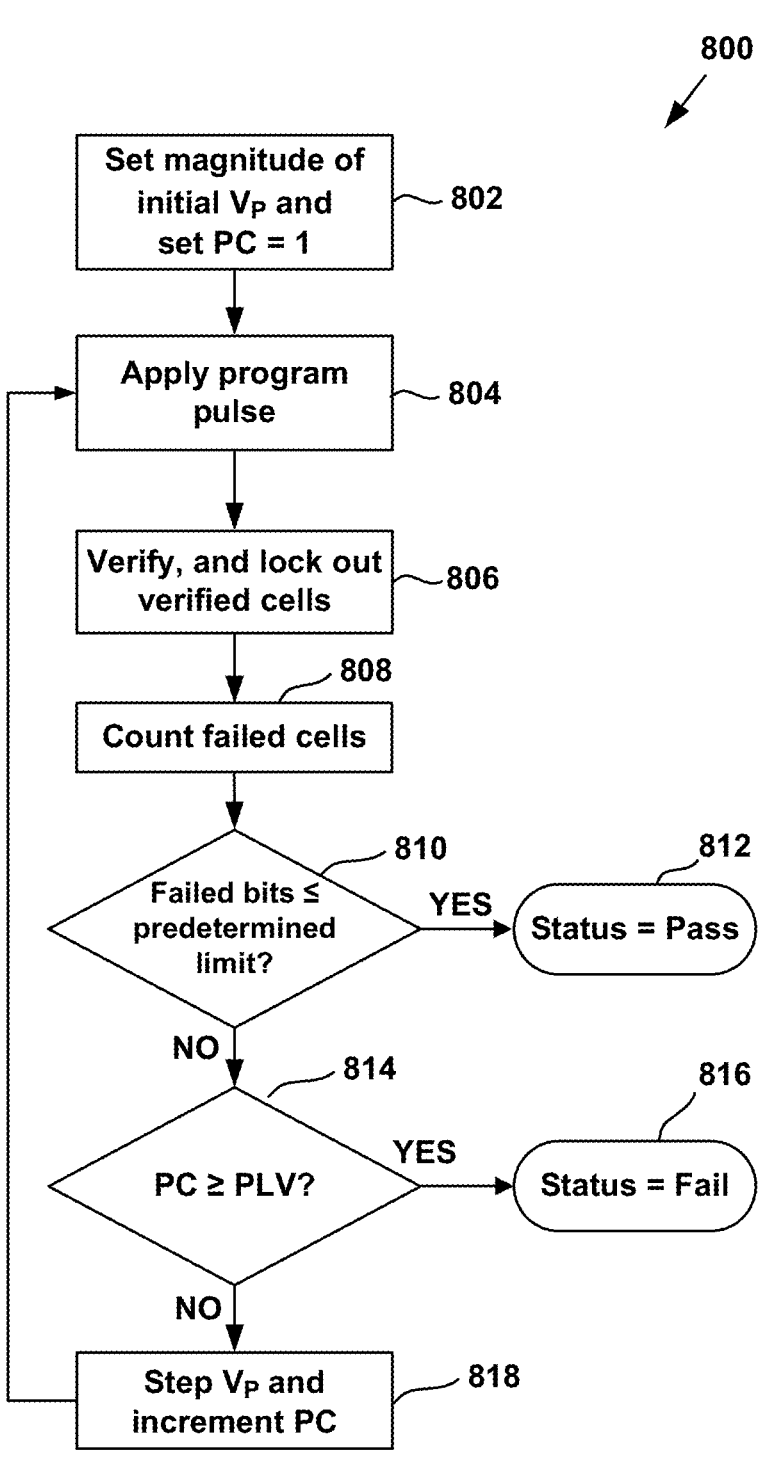
FIG. 8 is a flowchart describing an embodiment of a process for programming non-volatile memory.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above.

Additionally, process 800 can be used to implement each phase of a multi-phase programming process.

In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded.

If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 818 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 804 and another program pulse is applied to the selected word line so that another iteration (steps 804-818) of programming process 800 is performed. Each pass through steps 804-818 is referred to herein as a "program loop."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
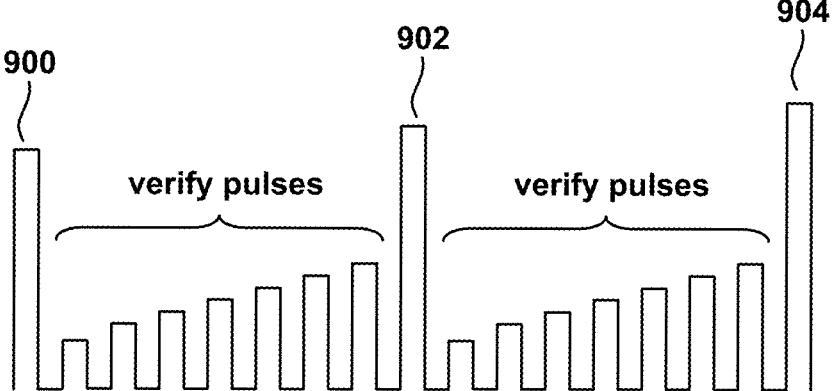
FIG. 9 depicts a word line voltage during programming and verify operations.

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

As described above, in embodiments a population of memory cells to be programmed is first erased so that all memory cells in the population are in an erased data state (e.g., state S0 in FIG. 5 or state E in FIG. 7A) prior to programming. When the programmed memory cells are subsequently selected to be re-programmed, the memory cells are again erased prior to programming.

Each program and erase iteration of a memory cell or group of memory cells is referred to herein as a "program-erase cycle," and the number of program-erase cycles performed on a memory cell or group of memory cells is referred to herein as a "program-erase cycle count" or "PEC." In embodiments, a Controller Device maintains a record of the program-erase cycle count for each memory cell or group of memory cells of a memory structure (e.g., memory structure 202 of FIG. 2A).

An erase operation for memory cells in a block typically involves one or more "erase-verify iterations," also referred to as "erase-verify loops," where each iteration involves channel boosting followed by an erase verify test, until the erase operation is completed.

In an embodiment of an erase-verify loop, the voltages of the channels are boosted while holding the voltages of the word lines at a low level (e.g., at or close to 0 V). In an embodiment, the channels are boosted by applying one or more erase pulses to the block. In one technique, one or more erase pulses are applied to select transistors to generate a GIDL current to boost the NAND string channel. Such a technique is referred to herein as "GIDL Erase."

In an embodiment, erase pulses are applied to a select transistor of a NAND string to provide a drain-to-gate voltage of a sufficiently high magnitude (referred to herein as a GIDL voltage or GV) that the select transistor generates a GIDL current. GIDL current is a result of carrier generation (e.g., electron-hole pair generation) due to band-to-band tunneling and/or trap-assisted generation.

GIDL current may be generated at either end of a NAND string. A drain side GIDL current may be generated by applying one or more erase pulses to provide a drain side GIDL voltage $GV_D$ between a drain terminal and a gate terminal of a drain side select transistor connected to a bit line. A source side GIDL current may be generated by applying one or more erase pulses to provide a source side GIDL voltage $GV_S$ between a drain terminal and a gate terminal of a source side select transistor connected to a source line.

GIDL erase based on a GIDL current generated at only one end of a NAND string (e.g., the drain side or the source side) is referred to as a one-sided GIDL Erase. GIDL Erase based on GIDL currents generated at both ends of a NAND string is referred to as a two-sided GIDL Erase.

In an embodiment, GIDL current may result in one type of carriers (e.g., holes) predominantly moving into the NAND channel and thereby raising the potential of (e.g., boosting) the channel. At the same time, another type of carrier (e.g., electrons) are extracted from the channel by an electric field.

For example, electrons may be extracted in the direction of a bit line or in the direction of a source line. Boosting the channel creates a large channel-to-gate voltage which drives holes into the charge trapping layers, reducing the threshold voltage of each memory cell.

Thus, in an embodiment one or more erase pulses are applied to provide a drain side GIDL voltage $GV_D$ to a drain side select transistor and/or one or more erase pulses are applied to provide a source side GIDL voltage $GV_S$ to a source side select transistor.

In an embodiment, each erase pulse includes a first erase pulse and a corresponding second erase pulse. In an embodiment, a GIDL Erase operation includes applying the first erase pulse (referred to herein as a "drain erase pulse") to a drain terminal of a select transistor while applying the corresponding second erase pulse (referred to herein as a "gate erase pulse") to a gate terminal of the select transistor. In an embodiment, the drain erase pulse and the corresponding gate erase pulse provide a GIDL voltage GV to the select transistor.

In an embodiment, one or more first drain erase pulses each having a magnitude Verase are applied to a drain terminal of a drain side select transistor while applying a corresponding one or more first gate erase pulses each having a magnitude Vsgd to a gate terminal of the drain side select transistor. In an embodiment, each first drain erase pulse and corresponding first gate erase pulse provide a drain side GIDL voltage $GV_D$ to the drain side select transistor. In such an embodiment, the drain side GIDL voltage is:

$$GV_D = (Verase - Vsgd) \qquad (1)$$

In addition or alternatively, one or more second drain erase pulses each having a magnitude Verase are applied to a drain terminal of a source side select transistor while applying a corresponding one or more second gate erase pulses each having a magnitude Vsgs to a gate terminal of the source side select transistor. In an embodiment, each second drain erase pulse and corresponding second gate erase pulse provide a source side GIDL voltage $GV_S$ to the source side select transistor. In such an embodiment, the source side GIDL voltage is:

$$GV_S = (Verase - Vsgs) \qquad (2)$$

In an embodiment, Verase may have a value of about 15V to about 25V, Vsgd may have a value of about 5V to about 15V, Vsgs may have a value of about 5V to about 15V, drain side GIDL voltage $GV_D$ may have a value of about 0V to about 20V, and source side GIDL voltage $GV_S$ may have a value of about 0V to about 20V, although other values may be used.

As can be seen from equations (1) and (2) above, if Verase has a fixed value, drain side GIDL voltage $GV_D$ and source side GIDL voltage $GV_S$ may be increased or decreased by decreasing or increasing, respectively, the gate erase pulse magnitudes Vsgd and Vsgs, respectively.

Conventionally, Verase, Vsgd, and Vsgs have fixed values (and therefore drain side GIDL voltage $GV_D$ and source side GIDL voltage $GV_S$ have fixed values) that may be determined based on simulation data or based on empirical data obtained from a sampling of actual memory die, or based on a combination of the two techniques.

An erase verify test, which is a sensing operation, can be performed after applying each erase pulse to determine if the threshold voltage of each memory cell has been lowered below an erase verify voltage. If the threshold voltage of a memory cell is below the erase verify voltage, the memory cell passes the erase verify test. If the threshold voltage of a memory cell is not below the erase verify voltage, the memory cell fails the erase verify test.

In embodiments, an erase operation for a block completes when fewer than a threshold number of memory cells in the block fail the erase verify test. As used herein, the threshold number is also called a "fail bits threshold number." The fail bits threshold number is sometimes referred to as a "bitscan pass/fail" or "BSPF" value.

In an embodiment, the fail bits threshold number BSPF is the number of bits that can be corrected by error correction codes (ECC) during a read process for the page of memory cells. In other embodiments, other criteria may be used for specifying the fail bits threshold number BSPF. In an embodiment, the fail bits threshold number BSPF has a fixed value. For example, the fail bits threshold number BSPF=25, or some other value.

In embodiment, an erase operation for a block must complete within a maximum number of erase-verify loops $(EV_M)$. For example, the maximum number of erase-verify loops $EV_M$ may be 6, or some other value. A block erase failure occurs if more than the fail bits threshold number BSPF of memory cells in the block fail erase verify tests within the maximum number of erase-verify loops $EV_M$. For example, if the fail bits threshold number BSPF=25 and the maximum number of erase-verify loops $EV_M$=6, a block erase failure may occur if more than 25 memory cells in the block fail erase verify tests within 6 erase-verify loops.

Figure 10:
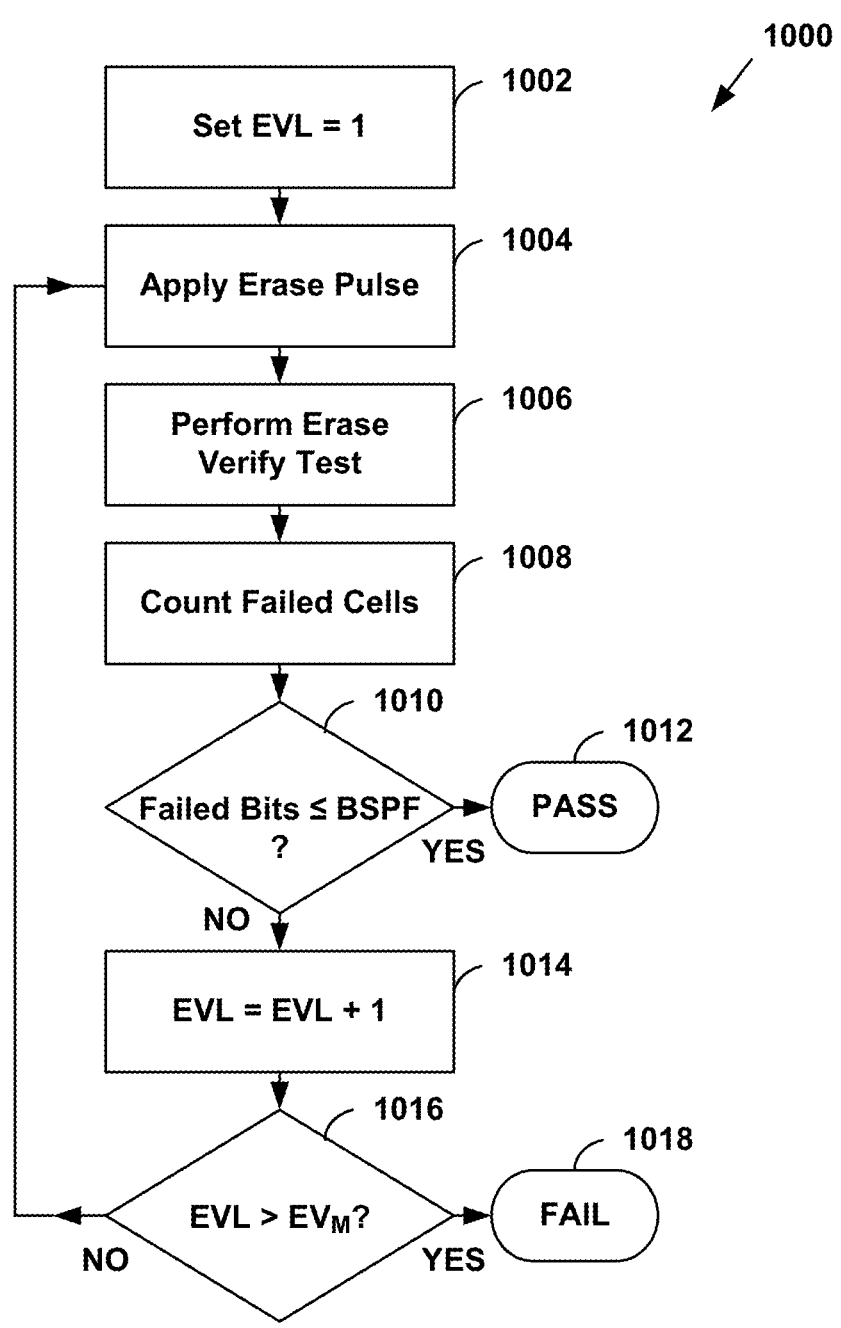
FIG. 10 depicts a flowchart describing an embodiment of a process for erasing a population of memory cells.

FIG. 10 is a flowchart describing an embodiment of a process 1000 for erasing a population of memory cells (e.g., an erase block of memory cells). In an example embodiment, process 1000 is performed on memory die 106 (FIG. 1) using the control circuits discussed above. For example, process 1000 can be performed at the direction of state machine 216 (FIG. 2).

In an embodiment, state machine 216 maintains as erase-verify loop counter EVL for the block of memory cells in process 1000. In step 1002 of process 1000, erase-verify loop counter EVL is initialized at 1.

At step 1004, an erase pulse is applied to the memory cells of the erase block. In an embodiment, each erase pulse may include a first drain erase pulse and a corresponding first gate erase pulse that provide a drain side GIDL voltage $GV_D$ to a drain side select transistor of each NAND string in the erase block, and/or may include a second drain erase pulse and a corresponding second gate erase pulse that provide a source side GIDL voltage $GV_S$ to a source side select transistor of each NAND string in the erase block.

At step 1006, an erase verify test is performed on the memory cells of the erase block, such as described above.

At step 1008, the memory system counts the number of memory cells in the erase block that have failed the erase verify test. That is, the system counts the number of memory cells in the erase block that have threshold voltages that are not below the erase verify voltage. This counting can be done by state machine 216 (FIG. 2), controller 104 (FIG. 1), or other logic.

At step 1010, a determination is made whether the count from step 1008 is less than or equal to fail bits threshold number BSPF. If a determination is made at step 1010 that the count at step 1008 is less than or equal to fail bits threshold number BSPF, then at step 1012 erase process 1000 is deemed to have passed.

In contrast, if at step 1010 a determination is made that the count at step 1008 is not less than or equal to fail bits threshold number BSPF, then at step 1014 erase-verify loop counter EVL is incremented by 1.

At step 1016, a determination is made whether erase-verify loop counter EVL is greater than the maximum number of erase-verify loops $EV_M$. If erase-verify loop counter EVL is greater than the maximum number of erase-verify loops $EV_M$, then at step 1018 erase process 1000 is deemed to have failed. In other words, within the maximum number of erase-verify loops $EV_M$ more than the fail bits threshold number BSPF of memory cells in the erase block fail erase verify tests, and the erase is deemed to have failed.

In contrast, if a determination is made that erase-verify loop counter EVL is less than or equal to the maximum number of erase-verify loops $EV_M$, process 1000 loops back to step 1004 and another erase pulse is applied to the memory cells of the erase block.

Thus, each pass through steps 1004-1010 is an example of an erase-verify loop. The loop of steps 1004-1016 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

In process 1000, if at step 1010 a determination is made that the count at step 1008 is less than or equal to fail bits threshold number BSPF then the value of erase-verify loop counter EVL is the number of erase-verify loops required for the erase block to pass the erase verify test of step 1006.

An indication of the time required complete a memory cell erase operation is referred to herein as erase speed, is described in terms of a number of erase-verify loops required for the memory cell to pass an erase verify test. For example, a first memory cell may pass an erase verify test in 2 erase-verify loops, and a second memory cell may pass the erase verify test in 6 erase-verify loops. In this context, the second memory cell may be said to have a slower erase speed than the first memory cell because the second memory cell requires more erase-verify loops to pass the erase verify test.

Erase speed tends to slow with increasing program-erase cycle count. In other words, as a memory cell is subjected to increasing program-erase cycle counts the memory cell requires more erase-verify loops to pass the erase verify test.

Without wanting to be bound by any particular theory, it is believed that this erase slowing is a result of a the formation of physical traps in oxide layers of the memory cells, and such trap formation increases with increasing program-erase cycle count.

In addition, without wanting to be bound by any particular theory, it is believed that this erase slowing is also result of decreasing GIDL current efficiency with increasing program-erase cycle count. In particular, without wanting to be bound by any particular theory, it is believed for a fixed GIDL voltage GV, as program-erase cycle count increases, GIDL current decreases, channel boosting decreases, and corresponding threshold voltage reduction decreases.

Figure 11:
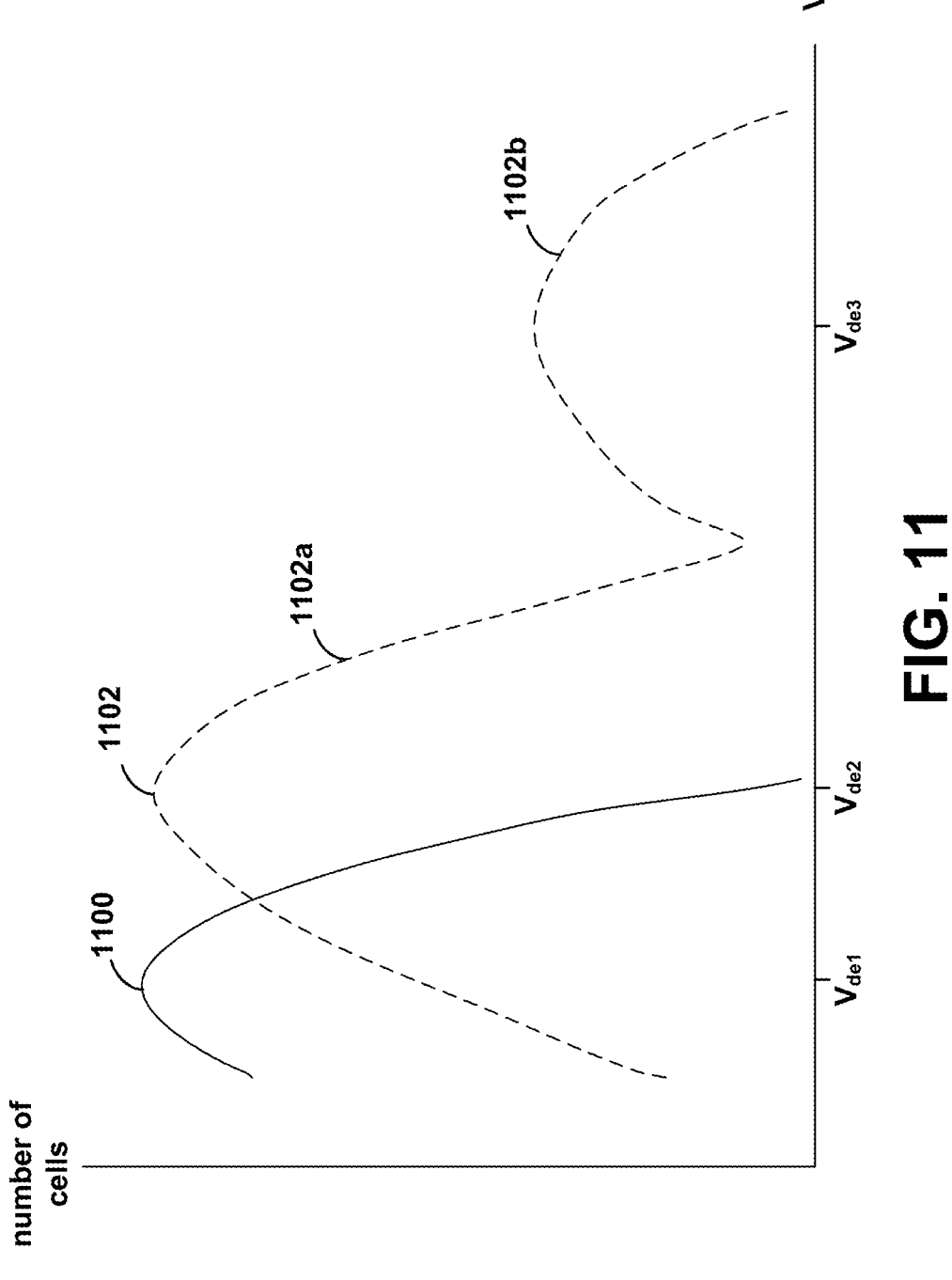
FIG. 11 depicts example erased threshold voltage distributions for a population of memory cells.

As a result of process variations, however, memory cells within the same ease block experience erase slowing to varying degrees. With increasing program-erase cycle counts, erase speed therefore may vary from memory cell-to-memory cell within an erase block. To illustrate, FIG. 11 depicts example erased threshold voltage distributions for a population of memory cells that have been erased using N erase-verify loops. For example, if N=2, each memory cell received N=2 erase pulses.

Curve 1100 depicts an example erased threshold voltage distribution for the population of memory cells at "fresh" (i.e., before any program-erase cycle counts). Curve 1100 has a single bell-shaped curve portion that is centered on a first erase threshold voltage Vde1 and that encompasses substantially all of the memory cells.

In contrast, curve 1102 depicts an example erased threshold voltage distribution for the same population of memory cells after M program-erase cycle counts (e.g., M=100 k program-erase cycle counts). Curve 1102 includes a first bell-shaped curve portion 1102a that is centered on a second erase threshold voltage Vde2, and a second bell-shaped curve portion 1102b that is centered on a third erase threshold voltage Vde3. First bell-shaped curve portion 1102a and second bell-shaped curve portion 1102b collectively encompass substantially all of the memory cells.

FIG. 11 illustrates two separate phenomena. First, after M=100 k program-erase cycle counts, substantially all of the memory cells are slower to erase than at fresh. In particular, after the same number of erase-verify loops (e.g., N=2), the threshold voltages of the memory cells after M=100 k program-erase cycle counts are all higher than the threshold voltages of the memory cells at fresh. Thus, all of the memory cells have experienced erase slowing compared to their behavior at fresh.

Second, the memory cells experience erase slowing to varying degrees. In particular, first bell-shaped curve portion 1102a corresponds to a first sub-population of the memory cells and second bell-shaped curve portion 1102b corresponds to a second sub-population of the memory cells. The second sub-population of the memory cells has experienced a greater amount of erase slowing than the first sub-population of the memory cells, as evidenced by the threshold voltage distribution of the second sub-population of the memory cells being higher than the threshold voltage distribution of the first sub-population of the memory cells.

As a result of the erase slowing, additional (e.g., >N) erase-verify loops would be needed to lower the threshold voltages of the memory cells to the vicinity of first erase threshold voltage Vde1. However, simply applying additional erase pulses may introduce other problems. In particular, reducing the threshold voltages of the second sub-population of memory cells to the vicinity of first erase threshold voltage Vde1 may require so many additional erase pulses that the first sub-population of memory cells becomes over-erased.

That is, the threshold voltages of the first sub-population of memory cells would be shifted much lower than first erase threshold voltage Vde1. Such over-erasing may then impact subsequent programming, increasing the number of program pulses required to program the over-erased memory cells. Over erasing also may decrease data retention and increase neighbor word line interference of the first sub-population of memory cells.

In example process 1000 of FIG. 10, at step 1004 an erase pulse is applied to provide a drain side GIDL voltage $GV_D$ to a drain side select transistor of each NAND string in the erase block and/or provide a source side GIDL voltage $GV_S$ to a source side select transistor of each NAND string in the erase block.

As described above, conventionally, Verase, Vsgd, and Vsgs have fixed values (and therefore drain side GIDL voltage $GV_D$ and source side GIDL voltage $GV_S$ have fixed values) that may be determined based on simulation data or based on empirical data obtained from a sampling of actual memory die, or based on a combination of the two techniques.

For memory cells at fresh, using fixed values for drain side GIDL voltage $GV_D$ and source side GIDL voltage $GV_S$ is not problematic because most memory cells erase at a uniform rate and the threshold is typically satisfied in one or two erase-verify loops. However, using fixed values for drain side GIDL voltage $GV_D$ and source side GIDL voltage $GV_S$ may become problematic because of the erase speed slowing that occurs with increasing program-erase cycle counts.

In particular, as described above, program-erase cycle count increases GIDL current efficiency decreases for a fixed GIDL voltage, which in turn reduces the amount of threshold voltage reduction for each erase pulse. Thus, without wanting to be bound by any particular theory, it is believed that using fixed values for drain side GIDL voltage $GV_D$ and source side GIDL voltage $GV_S$ results in less threshold voltage reduction per erase pulse as program-erase cycle count increases, therefore requiring more erase pulses at higher program-erase cycle counts.

In particular, as described above the threshold voltages of the memory cells being erased decrease at a slower rate with increasing program-erase cycle counts. As a result, for a given number of erase-verify loops in process 1000, a higher number of memory cells will fail the erase verify test at step 1006. This in turn will result in additional erase-verify loops needed to lower the threshold voltages of the memory cells. As described above, subjecting all of the memory cells in an erase block to additional erase-verify loops results in over-erasure of some of the memory cells in the erase block Technology is described to adaptively increase GIDL voltage to compensate for the reduction in GIDL current efficiency that occurs with increasing program-erase cycle counts.

To simplify the remaining discussion, the term "adaptive GIDL voltage $GV_a$" will be used to describe an adaptive drain side GIDL voltage $GV_D$ and/or an adaptive source side GIDL voltage $GV_S$. Persons of ordinary skill in the art will understand that the technology described below may be applied to one-sided and two-sided GIDL Erase techniques.

FIG. 12A1 is a flowchart describing an embodiment of a process 1200a for erasing a population of memory cells (e.g., an erase block of memory cells). In an example embodiment, process 1200a is performed on memory die 106 (FIG. 1) using the control circuits discussed above. For example, process 1200a can be performed at the direction of state machine 216 (FIG. 2).

In step 1202 of process 1200a, an erase-verify loop counter EVL maintained by state machine 216 is initialized at 1.

At step 1204, a program-erase cycle count is determined for the erase block. For example, as described above in an embodiment a Controller Device maintains a record of the program-erase cycle count for each memory cell or group of memory cells of a memory structure (e.g., memory structure 202 of FIG. 2A). In an embodiment, at step 1204 the program-erase cycle count for the erase block may be determined from this record.

At step 1206, an adaptive GIDL voltage $GV_a$ is determined based on the program-erase cycle count determined at step 1204. For example, FIG. 12A2 depicts a table of program-erase cycle count values and corresponding adaptive GIDL voltage $GV_a$ values. As described below, the adaptive GIDL voltage $GV_a$ value adaptively increases based on program-erase cycle count values.

In the illustrated example, the adaptive GIDL voltage $GV_a$ value adaptively increases in a step-wise manner based on program-erase cycle count values. In particular, for program-erase cycle count in a first range of values between 1 and 9,999, the corresponding adaptive GIDL voltage $GV_a$ equals an initial GIDL voltage $GV_0$ (e.g., 7.6V). Initial GIDL voltage $GV_0$ may be determined based on simulation data, or based on empirical data obtained from a sampling of actual memory die, or based on a combination of the two techniques.

For program-erase cycle count in a second range of values greater than the first range of values between 10,000 and 19,999, the corresponding adaptive GIDL voltage $GV_a$ equals the initial GIDL voltage $GV_0+\Delta$, where $\Delta$ is an offset value (e.g., $\Delta=0.2V$ or some other value). For program-erase cycle count in a third range of values greater than the second range of values between 20,000 and 29,999, the corresponding adaptive GIDL voltage $GV_a$ equals the initial GIDL voltage $GV_0+2\times\Delta$. For program-erase cycle count in a fourth range of values greater than the third range of values between 30,000 and 39,999, the corresponding adaptive GIDL voltage $GV_a$ equals the initial GIDL voltage $GV_0+3\times\Delta$, and so on.

In this regard, as the program-erase cycle count increases, the corresponding adaptive GIDL voltage $GV_a$ also increases. Without wanting to be bound by any particular theory, it is believed that increasing the adaptive GIDL voltage $GV_a$ as the program-erase cycle count increases may compensate for the reduction of GIDL current efficiency that occurs with increasing program-erase cycle count. Without wanting to be bound by any particular theory, it is believed that increasing the adaptive GIDL voltage $GV_a$ as the program-erase cycle count increases may provide a more uniform threshold voltage reduction per erase pulse independent of program-erase cycle count.

Thus, a lower GIDL voltage GV may be used for lower program-erase cycle counts and higher GIDL voltage GV may be used as the program-erase cycle count increases. Without wanting to be bound by any particular theory, it is believed that using an adaptive GIDL voltage $GV_a$ that varies based on program-erase cycle count may reduce the number of erase failures and reduce over-erasure of memory cells.

As described above, if Verase has a fixed value, drain side GIDL voltage $GV_D$ and source side GIDL voltage $GV_S$ may be increased or decreased by decreasing or increasing, respectively, the gate erase pulse magnitudes Vsgd and Vsgs, respectively.

Persons of ordinary skill in the art will understand that the program-erase cycle count stepwise breakpoint values may be other than those depicted in FIG. 12A2, and that more or fewer stepwise breakpoint values may be used. In addition, persons of ordinary skill in the art will understand that offset value A may be a fixed value, or may be a variable value. Further, persons of ordinary skill in the art will understand that adaptive GIDL voltage $GV_a$ may be determined in other ways based on the program-erase cycle count. For example, adaptive GIDL voltage $GV_a$ may be determined from a linear or non-linear equation based on the program-erase cycle count, or by some other technique.

Referring again to FIG. 12A1, at step 1208 an erase pulse is applied to the memory cells of the erase block using the adaptive GIDL voltage $GV_a$ determined at step 1206. In an embodiment, each erase pulse may include a first drain erase pulse and a corresponding first gate erase pulse that provide a drain side GIDL voltage $GV_D$ to a drain side select transistor of each NAND string in the erase block, and/or may include a second drain erase pulse and a corresponding second gate erase pulse that provide a source side GIDL voltage $GV_S$ to a source side select transistor of each NAND string in the erase block.

At step 1210, an erase verify test is performed on the memory cells of the erase block, such as described above. At step 1212, the memory system counts the number of memory cells in the erase block that have failed the erase verify test. That is, the system counts the number of memory cells in the erase block that have threshold voltages that are not below the erase verify voltage. This counting can be done by state machine 216 (FIG. 2), controller 104 (FIG. 1), or other logic.

At step 1214, a determination is made whether the count from step 1212 is less than or equal to fail bits threshold number BSPF. If a determination is made at step 1214 that the count at step 1212 is less than or equal to fail bits threshold number BSPF, then at step 1216 erase process 1200a is deemed to have passed.

In contrast, if a determination is made at step 1214 that the count at step 1212 is not less than or equal to fail bits threshold number BSPF, then at step 1218 erase-verify loop counter EVL is incremented by 1.

At step 1220, a determination is made whether erase-verify loop counter EVL is greater than the maximum number of erase-verify loops $EV_M$. If erase-verify loop counter EVL is greater than the maximum number of erase-verify loops $EV_M$, then at step 1222 erase process 1200a is deemed to have failed. In other words, within the maximum number of erase-verify loops $EV_M$ more than the fail bits threshold number BSPF of memory cells in the erase block fail erase verify tests, and the erase is deemed to have failed.

In contrast, if at step 1220 a determination is made that erase-verify loop counter EVL is not greater than the maximum number of erase-verify loops $EV_M$, process 1200a loops back to step 1208 and another erase pulse based on the adaptive GIDL voltage GV a determined at step 1206 is applied to the memory cells of the erase block.

The loop of steps 1208-1220 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

Without wanting to be bound by any particular theory, it is believed that using an adaptive GIDL Voltage $GV_a$ that varies based on program-erase cycle count, such as described above and depicted in FIGS. 12A1-12A2, fewer block erase failures will occur and memory system performance will improve.

In example process 1200a of FIG. 12A1 the value of adaptive GIDL Voltage $GV_a$ is determined directly based on program-erase cycle count. Alternatively, the value of adaptive GIDL Voltage $GV_a$ may be determined by other criteria indirectly related to program-erase cycle count.

For example, substantially all memory cells at fresh in an erase block may pass an erase verify test in K erase-verify loops (e.g., K=2). As described above, however, as the program-erase cycle count increases additional erase-verify loops (i.e., >K) are often needed to lower the threshold voltages of the memory cells. Thus, in another embodiment, the value of adaptive GIDL Voltage $GV_a$ may be adjusted when the number of erase-verify loops needed to lower the threshold voltages of the memory cells in an erase block is greater than K. Two example processes for implementing such an embodiment are described below. In the examples below, the variable K is also referred to as "erase loop upper limit K."

Figure 12B:
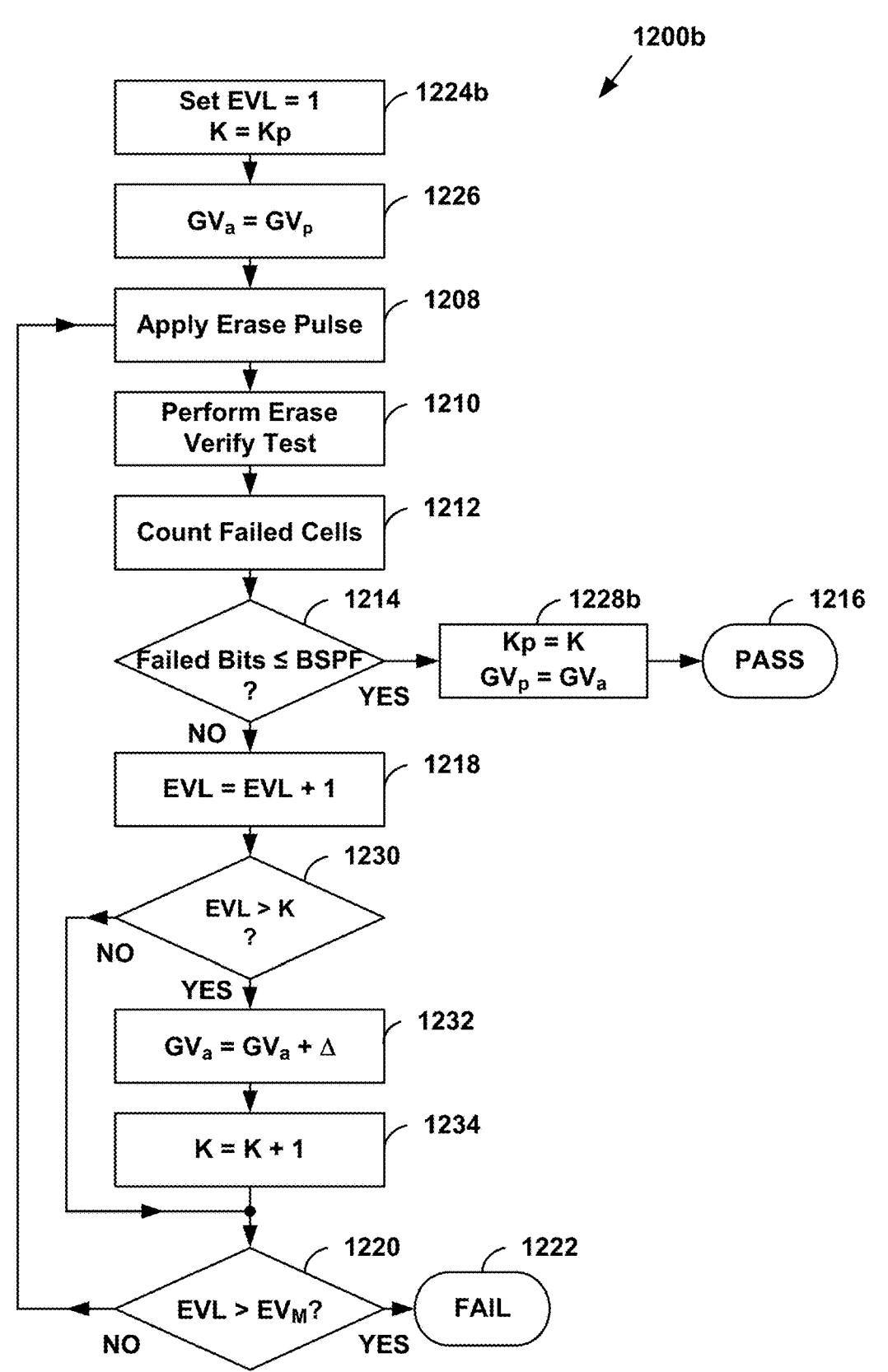
FIG. 12B depicts a flowchart describing an embodiment of another process for erasing a population of memory cells.

FIG. 12B is a flowchart describing an embodiment of a process 1200b for erasing a population of memory cells (e.g., an erase block of memory cells). In an example embodiment, process 1200b is performed on memory die 106 (FIG. 1) using the control circuits discussed above. For example, process 1200b can be performed at the direction of state machine 216 (FIG. 2).

In an embodiment process 1200b is implemented each time an erase block is erased. As described in more detail below, each time the erase block is successfully erased, two values are saved (e.g., in state machine 216): the current value of the erase loop upper limit K and the current value of the adaptive GIDL voltage $GV_a$. For example, the current value of erase loop upper limit K may be saved as the "previous erase loop upper limit Kp," and the current value of adaptive GIDL voltage $GV_a$ may be saved as the "previous adaptive GIDL voltage $GV_p$."

In an embodiment, prior to the first implementation of process 1200b on an erase block, the value of previous erase loop upper limit Kp is initialized to a predetermined value (e.g., Kp=2). Persons of ordinary skill in the art will understand that the value of previous erase loop upper limit Kp may be initialized to a value greater or less than 2. In an embodiment, prior to the first implementation of process 1200b on an erase block, the value of previous adaptive GIDL voltage $GV_p$ is set to an initial GIDL voltage $GV_0$. For example, $GV_0$=7.6V, or some other value.

In step 1224b of process 1200b, an erase-verify loop counter EVL maintained by state machine 216 is initialized at 1. In addition, the erase loop upper limit K is initialized to the value of previous erase loop upper limit Kp. So in the example described above, the erase loop upper limit K is initialized to K=2.

At step 1226, the adaptive GIDL voltage $GV_a$ is initialized to the value of previous adaptive GIDL voltage $GV_p$. On the first implementation of process 1200b on an erase block, the adaptive GIDL voltage $GV_a$ is initialized to the initial GIDL voltage $GV_0$. For example, $GV_a=GV_0$=7.6V.

At step 1208 an erase pulse is applied to the memory cells of the erase block using the adaptive GIDL voltage $GV_a$ specified at step 1226. In an embodiment, each erase pulse may include a first drain erase pulse and a corresponding first gate erase pulse that provide a drain side GIDL voltage $GV_D$ to a drain side select transistor of each NAND string in the erase block, and/or may include a second drain erase pulse and a corresponding second gate erase pulse that provide a source side GIDL voltage $GV_S$ to a source side select transistor of each NAND string in the erase block.

At step 1210, an erase verify test is performed on the memory cells of the erase block, such as described above. At step 1212, the memory system counts the number of memory cells in the erase block that have failed the erase verify test. That is, the system counts the number of memory cells in the erase block that have threshold voltages that are not below the erase verify voltage. This counting can be done by state machine 216 (FIG. 2), controller 104 (FIG. 1), or other logic.

At step 1214, a determination is made whether the count from step 1212 is less than or equal to fail bits threshold number BSPF. If a determination is made at step 1214 that the count at step 1212 is less than or equal to fail bits threshold number BSPF, then at step 1228b the current value of the erase loop upper limit K is saved as the value of previous erase loop upper limit Kp, and the current value of the adaptive GIDL voltage $GV_a$ is saved as the value of previous adaptive GIDL voltage $GV_p$. At step 1216 erase process 1200b is deemed to have passed.

In contrast, if a determination is made at step 1214 that the count at step 1212 is not less than or equal to fail bits threshold number BSPF, then at step 1218 erase-verify loop counter EVL is incremented by 1.

At step 1230, a determination is made whether erase-verify loop counter EVL is greater than erase loop upper limit K. If the erase-verify loop counter EVL is not greater than erase loop upper limit K, at step 1220 a determination is made whether erase-verify loop counter EVL is greater than the maximum number of erase-verify loops $EV_M$. If erase-verify loop counter EVL is greater than the maximum number of erase-verify loops $EV_M$, then at step 1222 erase process 1200b is deemed to have failed. In other words, within the maximum number of erase-verify loops $EV_M$ more than the fail bits threshold number BSPF of memory cells in the erase block fail erase verify tests, and the erase is deemed to have failed.

In contrast, if at step 1220 a determination is made that erase-verify loop counter EVL is not greater than the maximum number of erase-verify loops $EV_M$, process 1200a loops back to step 1208 and another erase pulse is applied to the memory cells of the erase block.

The loop of steps 1208-1220 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

If at step 1230 a determination is made that erase-verify loop counter EVL is greater than erase loop upper limit K, at step 1232 adaptive GIDL voltage $GV_a$ is set equal to the current value of adaptive GIDL voltage $GV_a$+Δ, where Δ is an offset value (e.g., Δ=0.2V or some other value). In this regard, when the erase-verify loop counter EVL is greater than erase loop upper limit K, the corresponding adaptive GIDL voltage $GV_a$ is increased.

Without wanting to be bound by any particular theory, it is believed that increasing the adaptive GIDL voltage $GV_a$ as the erase-verify loop count increases may compensate for the reduction of GIDL current efficiency that occurs with increasing program-erase cycle count. Without wanting to be bound by any particular theory, it is believed that increasing the adaptive GIDL voltage $GV_a$ as the erase-verify loop count increases may provide a more uniform threshold voltage reduction per erase pulse independent of program-erase cycle count.

Thus, a lower GIDL voltage GV may be used for lower erase-verify loop counts and higher GIDL voltage GV may be used as the erase-verify loop count increases. Without wanting to be bound by any particular theory, it is believed that using an adaptive GIDL voltage $GV_a$ that varies based on erase-verify loop count, such as described above and depicted in FIG. 12B, may reduce the number of erase failures and reduce over-erasure of memory cells.

At step 1234 erase loop upper limit K is incremented by a constant, such as 1. Persons of ordinary skill in the art will understand that at step 1234 erase loop upper limit K may be incremented by a constant greater than 1.

Thus, rather than increasing adaptive GIDL voltage $GV_a$ based solely on program-erase cycle count, process 1200b increases adaptive GIDL voltage $GV_a$ when the number of erase-verify loops starts to increase. In this regard, process 1200b may account for die-to-die variation in the amount of erase speed slowing that occurs with increasing program-erase cycle count.

For example, a first memory die may first exceed an erase loop upper limit K=2 beginning at 10,000 program-erase cycles, whereas a second memory die may first exceed an erase loop upper limit K=2 beginning at 50,000 program-erase cycles. Process 1200b therefore allows the adaptive GIDL voltage $GV_a$ to be increased based on the actual behavior of the memory die, rather than based only on the number of program-erase cycles.

Without wanting to be bound by any particular theory, it is believed that using an adaptive GIDL voltage $GV_a$ that varies based on an erase-verify loop counter EVL exceeding an erase loop upper limit K may reduce the number of erase failures and reduce over-erasure of memory cells.

Process 1200b then continues to step 1220 and a determination is made whether erase-verify loop counter EVL is greater than the maximum number of erase-verify loops $EV_M$. The loop of steps 1208-1220 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

On the next implementation of process 1200b on the same erase block, the erase loop upper limit K and the adaptive GIDL voltage $GV_a$ will be initialized at steps 1224b and 1226, respectively, to the values of these variables from the previous instance that process 1200b was implemented on the same erase block and that were saved at step 1228b as the previous value of erase loop upper limit Kp and the previous value of the adaptive GIDL voltage $GV_p$.

In process 1200b, the value of erase loop upper limit K is incremented by 1 at step 1234 each time the erase-verify loop counter EVL exceeds the value of erase loop upper limit K. Without wanting to be bound by any particular theory, it is believed that this will permit the value of erase loop upper limit K to gradually increase as the erase speed of the erase block begins to decrease.

Figure 12C:
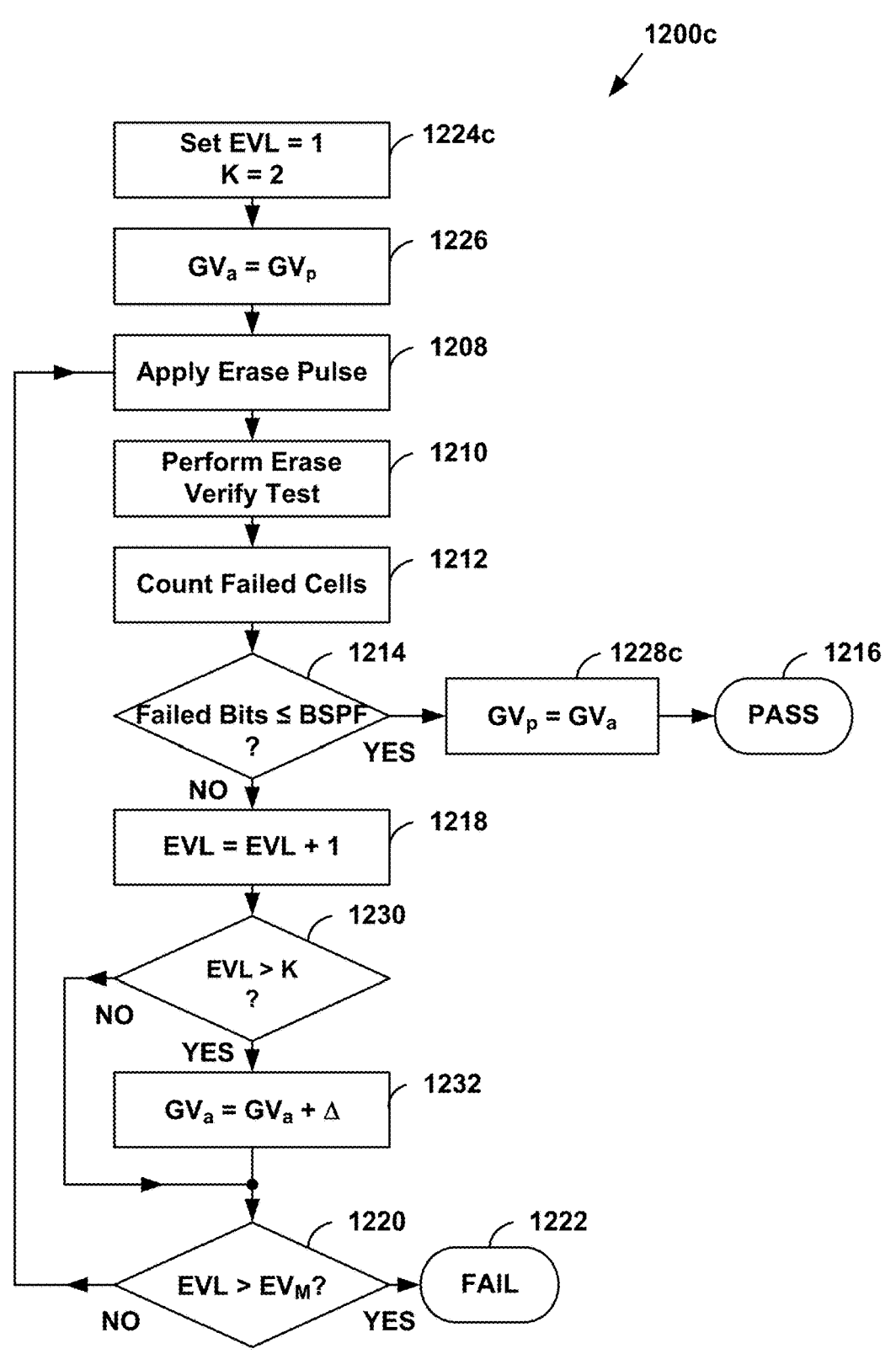
FIG. 12C depicts a flowchart describing an embodiment of still another process for erasing a population of memory cells.

Alternatively, rather than allowing the value of erase loop upper limit K to gradually increase as the erase speed of the erase block begins to decrease, the value of erase loop upper limit K can be fixed to a desired value (e.g., K=2). FIG. 12C describes such an embodiment.

In particular, FIG. 12C is a flowchart of a process 1200c for erasing a population of memory cells (e.g., an erase block of memory cells). In an example embodiment, process $1200c$ is performed on memory die 106 (FIG. 1) using the control circuits discussed above. For example, process $1200c$ can be performed at the direction of state machine 216 (FIG. 2).

In an embodiment process $1200c$ is implemented each time an erase block is erased. As described in more detail below, each time the erase block is successfully erased, the current value of the adaptive GIDL voltage $GV_a$ is saved (e.g., in state machine 216). For example, the current value of adaptive GIDL voltage $GV_a$ may be saved as the "previous adaptive GIDL voltage $GV_p$."

In an embodiment, prior to the first implementation of process $1200c$ on an erase block, the value of previous adaptive GIDL voltage $GV_p$ is set to an initial GIDL voltage $GV_0$. For example, $GV_0=7.6V$, or some other value.

In step $1224c$ of process $1200b$, an erase-verify loop counter EVL maintained by state machine 216 is initialized at 1, and the erase loop upper limit K is initialized to a predetermined value, e.g., K=2. Other values may be used for erase loop upper limit K.

At step 1226, the Value of adaptive GIDL voltage $GV_a$ is initialized to the value of previous adaptive GIDL voltage $GV_p$. On the first implementation of process $1200b$ on an erase block, the value of adaptive GIDL voltage $GV_a$ is initialized to the value of initial GIDL voltage $GV_0$. For example, $GV_a=GV_0=7.6V$.

At step 1208 an erase pulse is applied to the memory cells of the erase block. In an embodiment, each erase pulse may include a first drain erase pulse and a corresponding first gate erase pulse that provide a drain side GIDL voltage $GV_D$ to a drain side select transistor of each NAND string in the erase block, and/or may include a second drain erase pulse and a corresponding second gate erase pulse that provide a source side GIDL voltage $GV_S$ to a source side select transistor of each NAND string in the erase block.

At step 1210, an erase verify test is performed on the memory cells of the erase block, such as described above.

At step 1212, the memory system counts the number of memory cells in the erase block that have failed the erase verify test. That is, the system counts the number of memory cells in the erase block that have threshold voltages that are not below the erase verify voltage. This counting can be done by state machine 216 (FIG. 2), controller 104 (FIG. 1), or other logic.

At step 1214, a determination is made whether the count from step 1212 is less than or equal to fail bits threshold number BSPF. If a determination is made at step 1214 that the count at step 1212 is less than or equal to fail bits threshold number BSPF, then at step $1228c$ the current value of the adaptive GIDL voltage $GV_a$ is saved as the value of previous adaptive GIDL voltage $GV_p$. At step 1216 erase process $1200c$ is deemed to have passed.

In contrast, if a determination is made at step 1214 that the count at step 1212 is not less than or equal to fail bits threshold number BSPF, then at step 1218 erase-verify loop counter EVL is incremented by 1.

At step 1230, a determination is made whether erase-verify loop counter EVL is greater than erase loop upper limit K. If the erase-verify loop counter EVL is not greater than erase loop upper limit K, at step 1220 a determination is made whether erase-verify loop counter EVL is greater than the maximum number of erase-verify loops $EV_M$. If erase-verify loop counter EVL is greater than the maximum number of erase-verify loops $EV_M$, then at step 1222 erase process $1200b$ is deemed to have failed. In other words, within the maximum number of erase-verify loops $EV_M$ more than the fail bits threshold number BSPF of memory cells in the erase block fail erase verify tests, and the erase is deemed to have failed.

In contrast, if at step 1220 a determination is made that erase-verify loop counter EVL is not greater than the maximum number of erase-verify loops $EV_M$, process $1200a$ loops back to step 1208 and another erase pulse is applied to the memory cells of the erase block.

The loop of steps 1208-1220 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

If at step 1230 a determination is made that erase-verify loop counter EVL is greater than erase loop upper limit K, at step 1232 adaptive GIDL voltage $GV_a$ is set equal to the current value of adaptive GIDL voltage $GV_a+\Delta$, where $\Delta$ is an offset value (e.g., $\Delta=0.2V$ or some other value). In this regard, when the erase-verify loop counter EVL is greater than erase loop upper limit K, the corresponding adaptive GIDL voltage $GV_a$ is increased.

Without wanting to be bound by any particular theory, it is believed that increasing the adaptive GIDL voltage $GV_a$ as the erase-verify loop count increases may compensate for the reduction of GIDL current efficiency that occurs with increasing program-erase cycle count. Without wanting to be bound by any particular theory, it is believed that increasing the adaptive GIDL voltage $GV_a$ as the erase-verify loop count increases may provide a more uniform threshold voltage reduction per erase pulse independent of program-erase cycle count.

Thus, a lower GIDL voltage GV may be used for lower erase-verify loop counts and higher GIDL voltage GV may be used as the erase-verify loop count increases. Without wanting to be bound by any particular theory, it is believed that using an adaptive GIDL voltage $GV_a$ that varies based on erase-verify loop count, such as described above and depicted in FIG. 12C, may reduce the number of erase failures and reduce over-erasure of memory cells.

Thus, rather than increasing adaptive GIDL voltage $GV_a$ based solely on program-erase cycle count, process $1200c$ increases adaptive GIDL voltage $GV_a$ when the number of erase-verify loops starts to increase. In this regard, process $1200c$ may account for die-to-die variation in the amount of erase speed slowing that occurs with increasing program-erase cycle count.

For example, a first memory die may first exceed an erase loop upper limit K=2 beginning at 10,000 program-erase cycles, whereas a second memory die may first exceed an erase loop upper limit K=2 beginning at 50,000 program-erase cycles. Process $1200c$ therefore allows the adaptive GIDL voltage $GV_a$ to be increased based on the actual behavior of the memory die, rather than based only on the number of program-erase cycles.

At step 1220 a determination is made whether erase-verify loop counter EVL is greater than the maximum number of erase-verify loops $EV_M$. The loop of steps 1208-1220 is repeated until the number of memory cells in the erase block that have failed the erase verify test is less than or equal to fail bits threshold number BSPF (whereby the erase operation passes), or the erase-verify loop counter EVL is greater than the maximum number of erase-verify loops $EV_M$ (whereby the erase operation fails).

In addition, if process $1200c$ results in successfully erasing the memory cells in the erase block, at step $1228c$ the current value of the adaptive GIDL voltage $GV_a$ is saved as the value of the previous adaptive GIDL voltage $GV_p$. In this regard, on the next implementation of process 1200c on the same erase block, the value of adaptive GIDL voltage $GV_a$ will be initialized at step 1226 to the value of this variable from the previous instance that process 1200c was implemented on the same erase block.

One embodiment includes an apparatus that includes a block of memory cells having a NAND string that includes a first select transistor, and a control circuit coupled to the block of memory cells. The control circuit is configured to perform an erase operation on the block of memory cells by determining a first count of a number of times that the block of memory cells previously has been programmed and erased, determining based on the first count a first drain-to-gate voltage of the first select transistor, wherein the first drain-to-gate voltage is configured to cause the first select transistor to generate a first gate-induced drain leakage current, and applying a first erase pulse to the first select transistor based on the determined first drain-to-gate voltage.

One embodiment includes an apparatus that includes a block of memory cells having a NAND string that includes a select transistor, and a control circuit coupled to the block of memory cells. The control circuit is configured to perform an erase operation on the block of memory cells in a plurality of erase-verify loops, determine based on a number of erase-verify loops performed on the erase block a drain-to-gate voltage of the select transistor, wherein the drain-to-gate voltage is configured to cause the select transistor to generate a gate-induced drain leakage current, and apply a first erase pulse to the select transistor based on the determined drain-to-gate voltage.

One embodiment includes a method that includes performing in a plurality of erase-verify loops a first erase operation on a block of memory cells having a NAND string that includes a select transistor. Each erase-verify loop includes applying an erase pulse to the select transistor, wherein the erase pulse comprises providing a drain-to-gate voltage of the select transistor, wherein the drain-to-gate voltage is configured to cause the select transistor to generate a gate-induced drain leakage current, performing a first erase verify test on the block of memory cells, counting a number of memory cells in the block that failed the erase verify test, determining that the count is greater than a threshold number, incrementing the number of erase-verify loops performed on the erase block, determining that the number of erase-verify loops exceeds an erase loop upper limit, and incrementing the drain-to-gate voltage by an offset.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

The invention claimed is:

1. An apparatus comprising:
a block of memory cells comprising a NAND string that includes a first select transistor; and
a control circuit coupled to the block of memory cells, the control circuit configured to perform an erase operation on the block of memory cells by:
determining a first count of a number of times that the block of memory cells previously has been programmed and erased;
determining based on the first count a first drain-to-gate voltage of the first select transistor, wherein the first drain-to-gate voltage is configured to cause the first select transistor to generate a first gate-induced drain leakage current, wherein the first drain-to-gate voltage adaptively changes in a step-wise manner based on the first count; and
applying a first erase pulse to the first select transistor based on the determined first drain-to-gate voltage.

2. The apparatus of claim 1, wherein the first drain-to-gate voltage adaptively increases as a number of times that the block of memory cells previously has been programmed and erased increases.

3. The apparatus of claim 1, wherein the first drain-to-gate voltage comprises:
an initial first drain-to-gate voltage when the first count is within a first range of values; and
the initial first drain-to-gate voltage plus an offset when the first count is within a second range of values greater than the first range of values.

4. The apparatus of claim 3, wherein the offset is a fixed value.

5. The apparatus of claim 1, wherein the first drain-to-gate voltage is determined from a linear or non-linear equation based on the program-erase cycle count.

6. The apparatus of claim 1, wherein:
the NAND string further includes a second select transistor; and
the control circuit is further configured to perform the erase operation on the block of memory cells by:
determining based on the first count a second drain-to-gate voltage of the second select transistor, wherein the second drain-to-gate voltage is configured to cause the second select transistor to generate a second gate-induced drain leakage current; and applying a second erase pulse to the second select transistor based on the determined second drain-to-gate voltage.

7. The apparatus of claim 6, wherein the second drain-to-gate voltage adaptively increases based on the first count.

8. The apparatus of claim 6, wherein the second drain-to-gate voltage adaptively increases as a number of times that the block of memory cells previously has been programmed and erased increases.

9. The apparatus of claim 1, wherein the control circuit is further configured to:

perform an erase verify test on the block of memory cells;

count a number of memory cells in the block that failed the erase verify test;

determine that the count is less than or equal to a threshold number; and determine that the erase operation passed.

10. The apparatus of claim 1, wherein the control circuit is further configured to:

perform an erase verify test on the block of memory cells;

count a number of memory cells in the block that failed the erase verify test;

determine that the count is greater than a threshold number; and determine that the erase operation failed.

11. The apparatus of claim 1 determining the first drain-to-gate voltage is further based on a number of failed cells.

12. The apparatus of claim 1 wherein the first drain-to-gate voltage further adaptively changes in a step-wise manner based on an offset value.

* * * * *